United States Patent
Angioni

(10) Patent No.: US 12,048,174 B2
(45) Date of Patent: Jul. 23, 2024

(54) COMBINED CHARGE TRANSPORTING AND EMITTING LAYER WITH IMPROVED MORPHOLOGY AND BALANCED CHARGE TRANSPORTING PROPERTIES

(71) Applicant: SHARP KABUSHIKI KAISHA, Sakai (JP)

(72) Inventor: Enrico Angioni, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 370 days.

(21) Appl. No.: 17/177,942

(22) Filed: Feb. 17, 2021

(65) Prior Publication Data

US 2022/0263041 A1 Aug. 18, 2022

(51) Int. Cl.
| | |
|---|---|
| H10K 50/115 | (2023.01) |
| H10K 50/15 | (2023.01) |
| H10K 50/16 | (2023.01) |
| H10K 50/17 | (2023.01) |
| H10K 71/00 | (2023.01) |
| H10K 71/12 | (2023.01) |
| H10K 71/40 | (2023.01) |
| H10K 101/30 | (2023.01) |

(52) U.S. Cl.
CPC .......... *H10K 50/115* (2023.02); *H10K 50/15* (2023.02); *H10K 50/16* (2023.02); *H10K 50/17* (2023.02); *H10K 50/171* (2023.02); *H10K 71/00* (2023.02); *H10K 71/12* (2023.02); *H10K 71/40* (2023.02); *H10K 2101/30* (2023.02)

(58) Field of Classification Search
None
See application file for complete search history.

(56) References Cited

U.S. PATENT DOCUMENTS

| 10,581,007 B2 | 3/2020 | Angioni et al. | |
|---|---|---|---|
| 2019/0280232 A1* | 9/2019 | Chang | H10K 71/00 |
| 2019/0305241 A1* | 10/2019 | Angioni | H10K 50/115 |

OTHER PUBLICATIONS

Gaiwad, Abhinav M., et al. "Identifying orthogonal solvents for solution processed organic transistors," Organic Electronics, vol. 30, 2016, pp. 18-29 (https://doi.org/ 10.1016/j.orgel.2015.12.008).

(Continued)

*Primary Examiner* — Daniel Whalen
(74) *Attorney, Agent, or Firm* — ScienBiziP, P.C.

(57) ABSTRACT

A light-emitting structure includes a substrate and a plurality of sub-pixel structures over the substrate. At least one of the plurality of sub-pixel structures includes an anode, a cathode, and a combined charge transport and emissive layer disposed between the anode and the cathode. The combined charge transport and emissive layer includes quantum dots (QDs) with ligands, and nanoparticles smaller than the QDs. The QDs and the nanoparticles are dispersed in a crosslinked matrix formed at least partially from at least one crosslinkable charge transport material other than the ligands, and the combined charge transport and emissive layer is arranged with the QDs and the nanoparticles phase segregated in an upper outer surface of the crosslinkable charge transport material, with the nanoparticles arranged closer to the upper outer surface than the QDs.

9 Claims, 14 Drawing Sheets

(56) References Cited

OTHER PUBLICATIONS

Coe-Sullivan, S., et al., "Large-Area Ordered Quantum-Dot Monolayers via Phase Separation During Spin-Casting," Adv. Funct. Mater., vol. 15, No. 7, 2005, pp. 1117-1124 (https://doi.org/10.1002/adfm.200400468).
Dai, Xingliang, et al., "Solution-processed, high-performance light-emitting diodes based on quantum dots," Nature, vol. 515, 2014, pp. 96-99 (https://doi.org/10.1038/ nature13829).
Tsai, Kuen-Wei, et al., "Solution-Processed Thermally Activated Delayed Fluorescent OLED with High EQE as 31% Using High Triplet Energy Crosslinkable Hole Transport Materials," Adv. Funct. Mater., vol. 29, No. 15, 2019, 1901025 (https://doi.org/10.1002/adfm.201901025).
Zhang, Zhenxing, et al., "High-Performance, Solution-Processed, and Insulating-Layer-Free Light-Emitting Diodes Based on Colloidal Quantum Dots," Adv. Mater., vol. 30, No. 28, 2018, 1801387 (https://doi.org/10.1002/adma.201801387).
Tang, Pengyu, et al., "Realizing 22.3% EQE and 7-Fold Lifetime Enhancement in QLEDs: via Blending Polymer TFB and Cross-linkable Small Molecule for Solvent-Resistant Hole Transport Layer," ACS Appl. Mater. Interfaces, vol. 12, No. 11, 2020, pp. 13087-13095 (https://doi.org/10.1021/acsami.0c01001).
Rahmati, Mohammad, et al., "Highly Efficient Quantum Dot Light-Emitting Diodes by Inserting Multiple Poly(methyl methacrylate) as Electron-Blocking Layers," Adv. Funct. Mater., vol. 29, No. 50, 2019, 1906742 (https://doi.org/10.1002/adfm.201906742).

\* cited by examiner

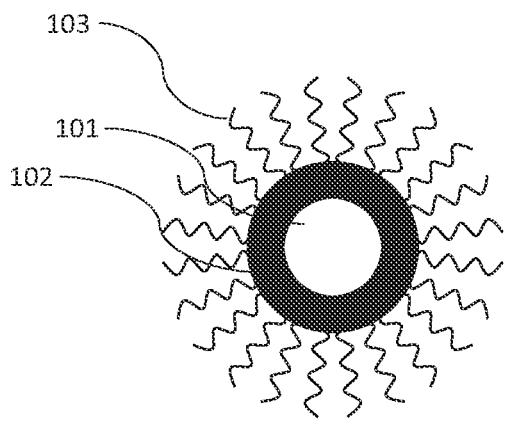
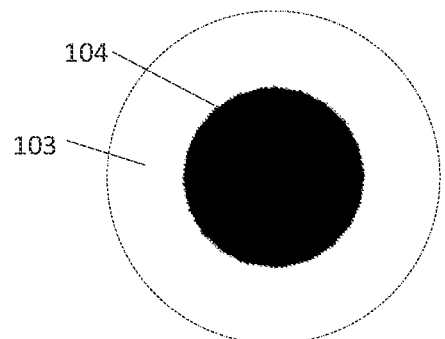
FIG. 1.1    FIG. 1.2
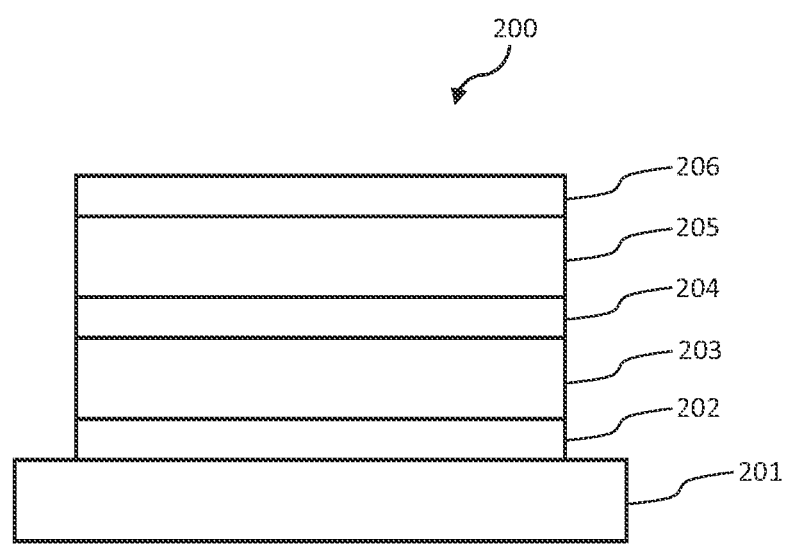
FIG. 2

FIG. 3.1
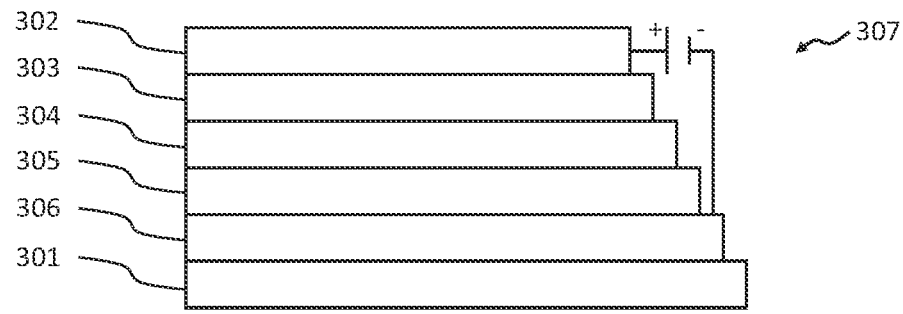
FIG. 3.2
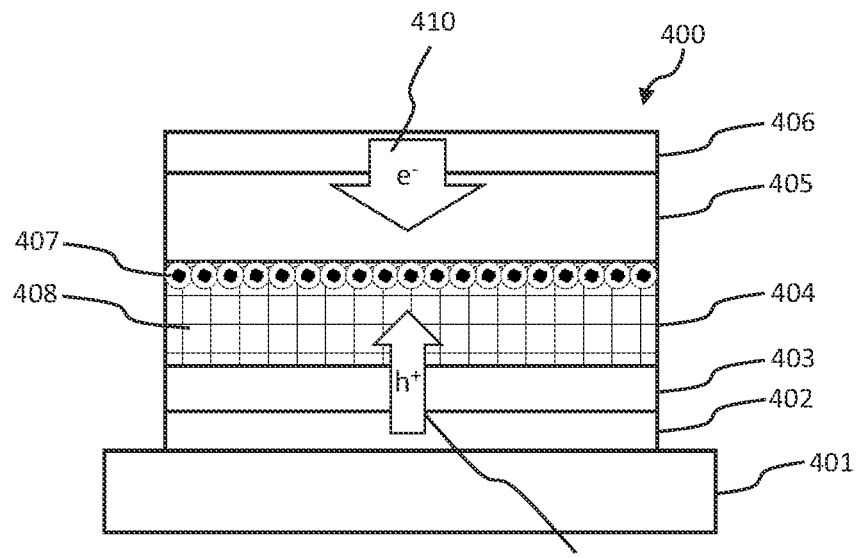
FIG. 4.1

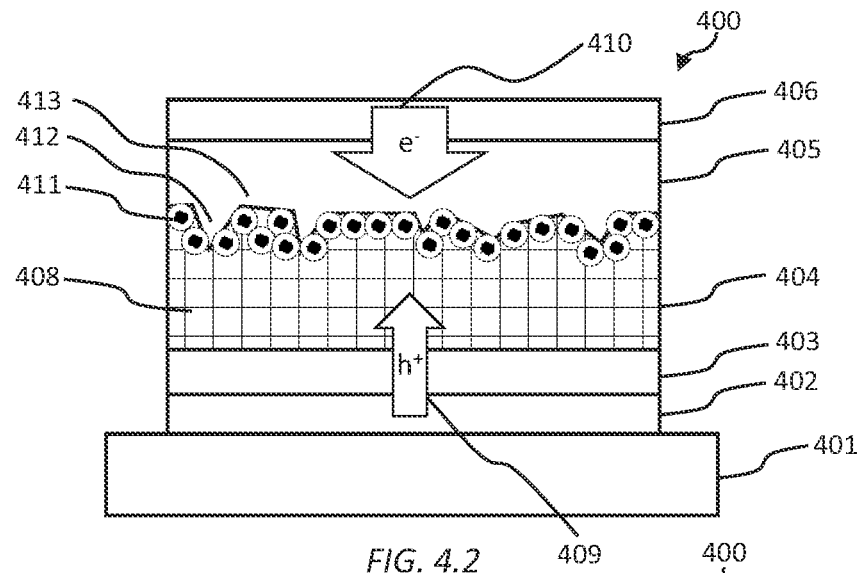
FIG. 4.2
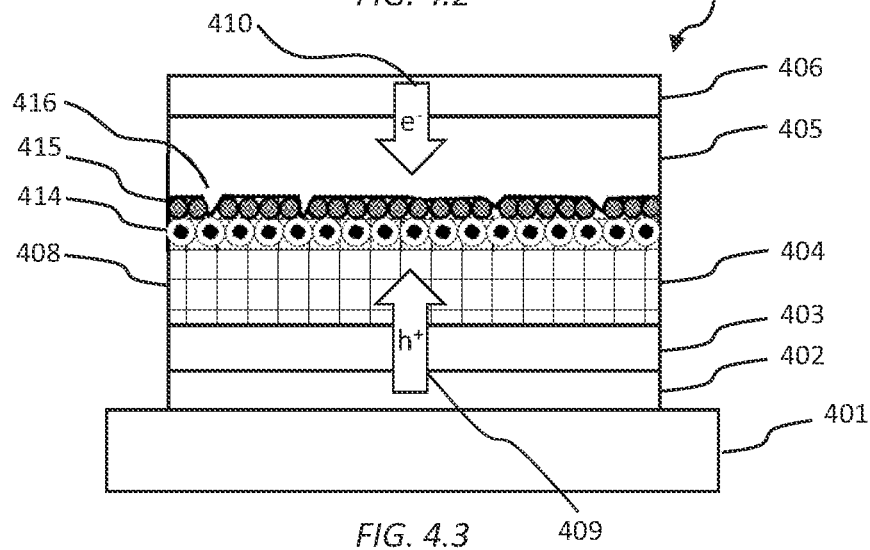
FIG. 4.3
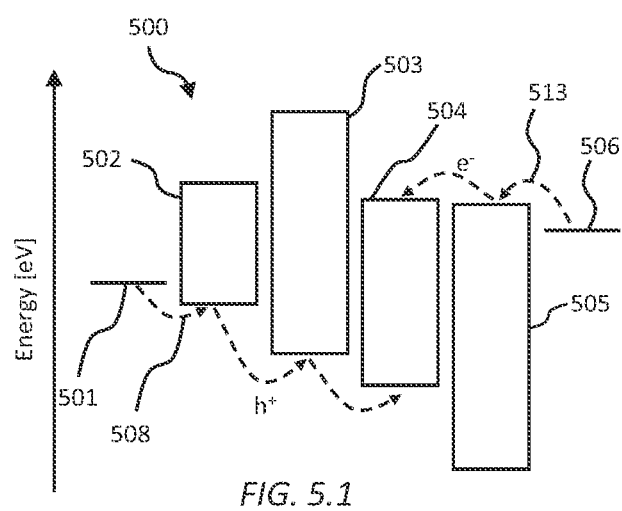
FIG. 5.1

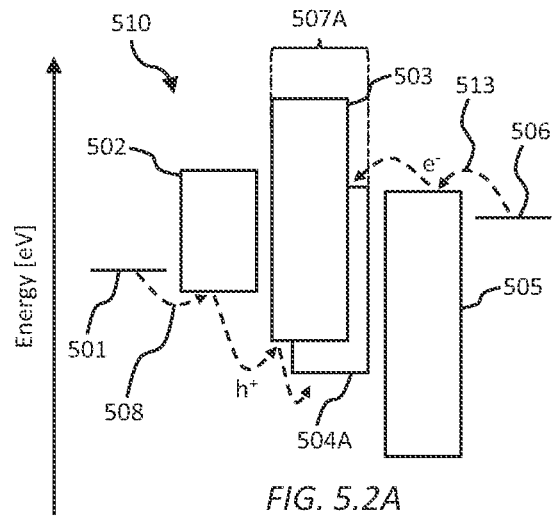
FIG. 5.2A
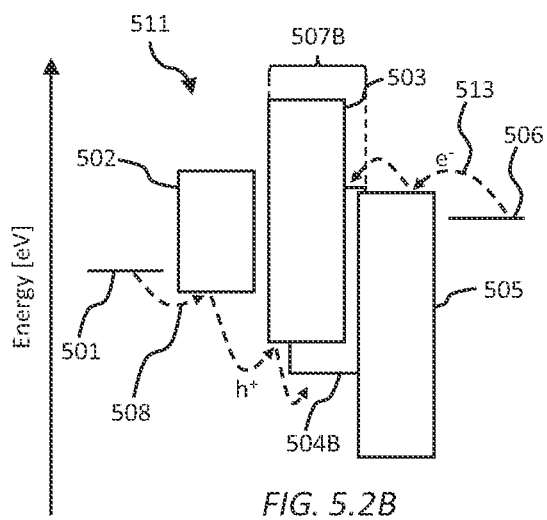
FIG. 5.2B
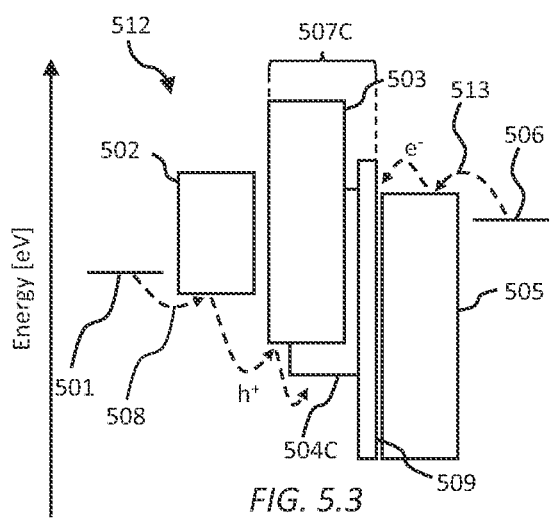
FIG. 5.3

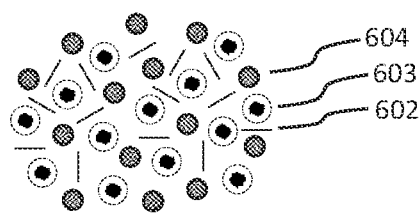
FIG. 6.1
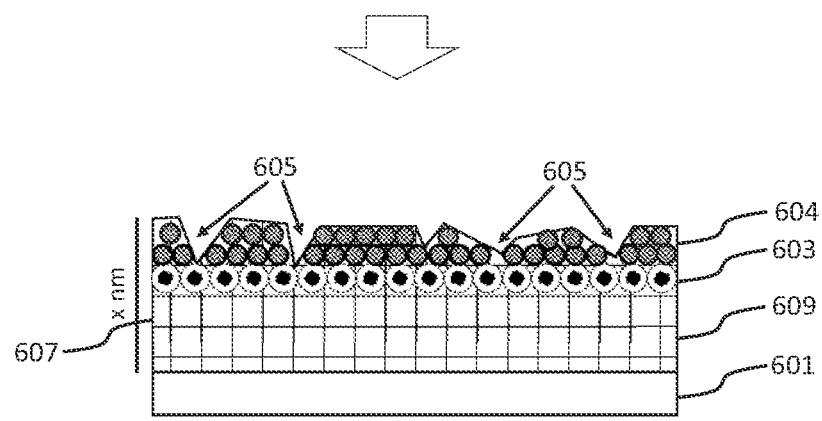
FIG. 6.2
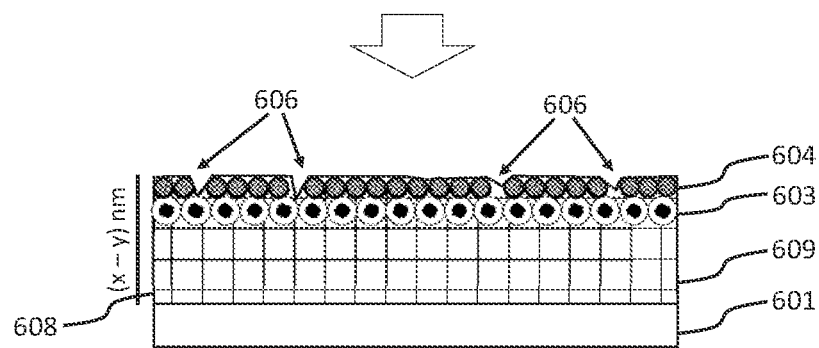
FIG. 6.3

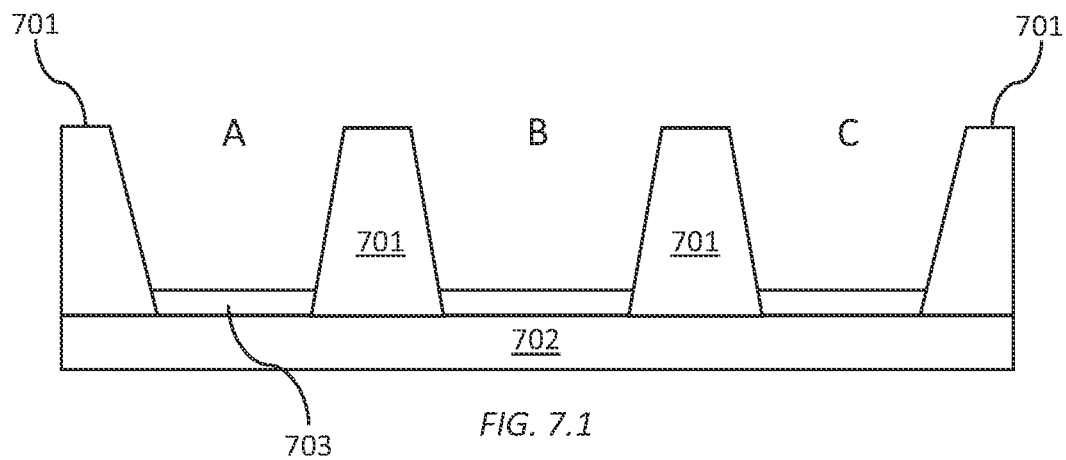
FIG. 7.1
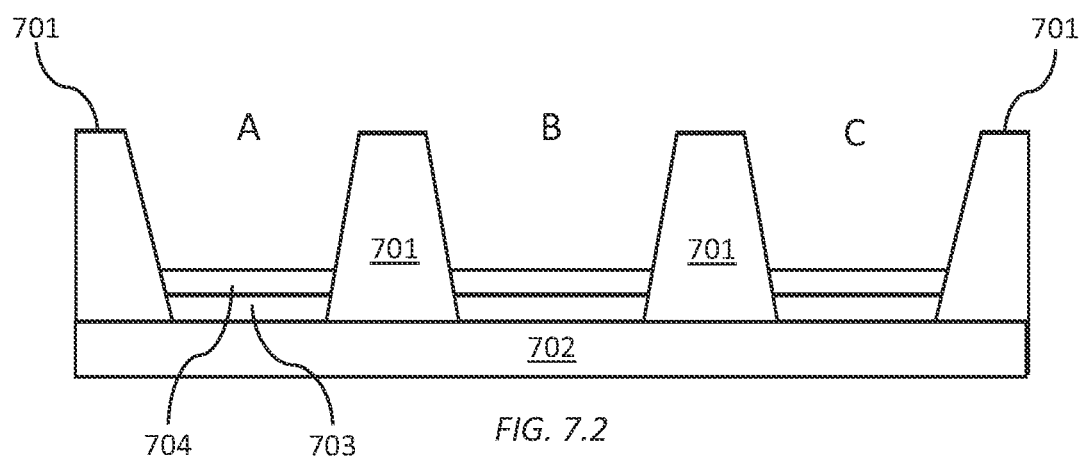
FIG. 7.2
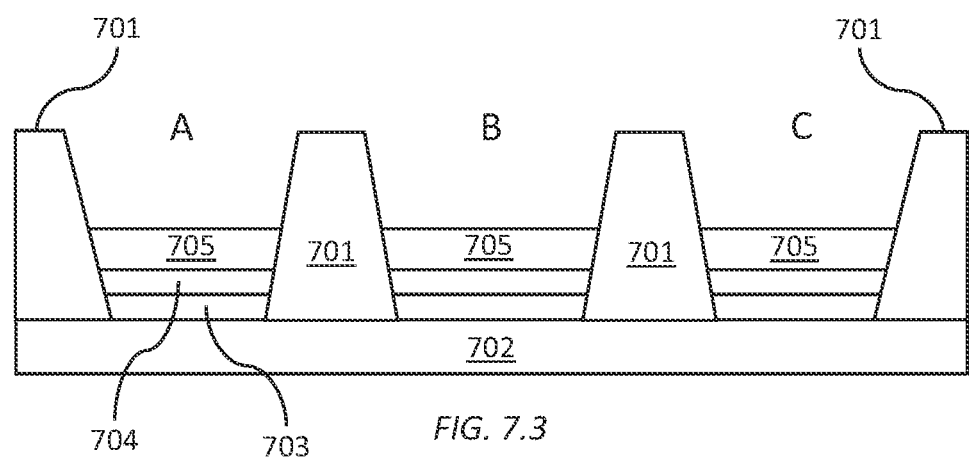
FIG. 7.3

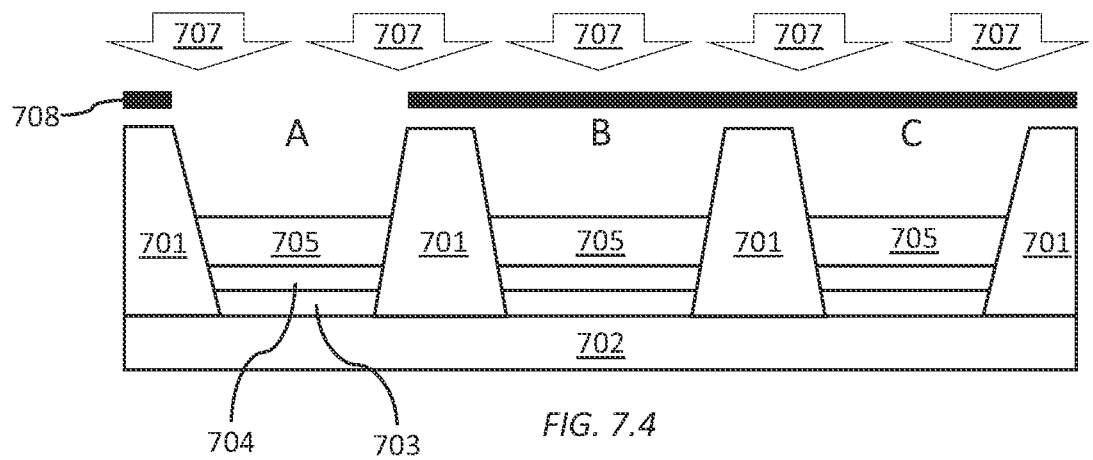
FIG. 7.4
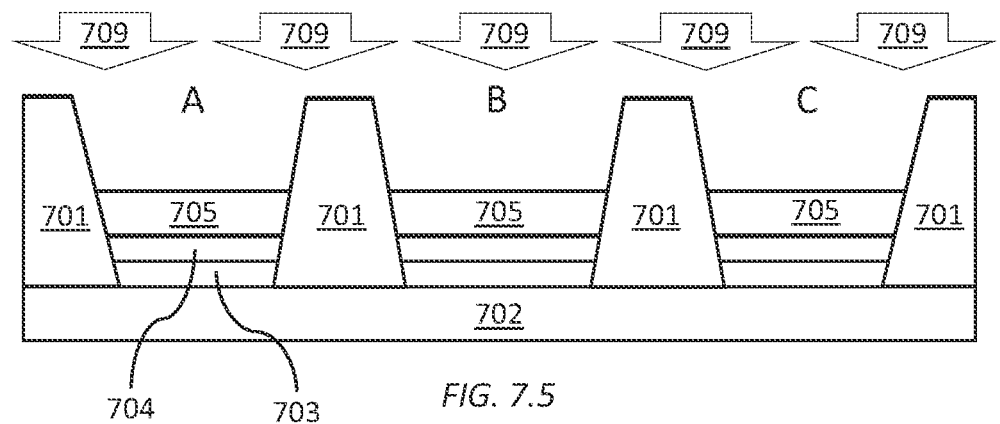
FIG. 7.5
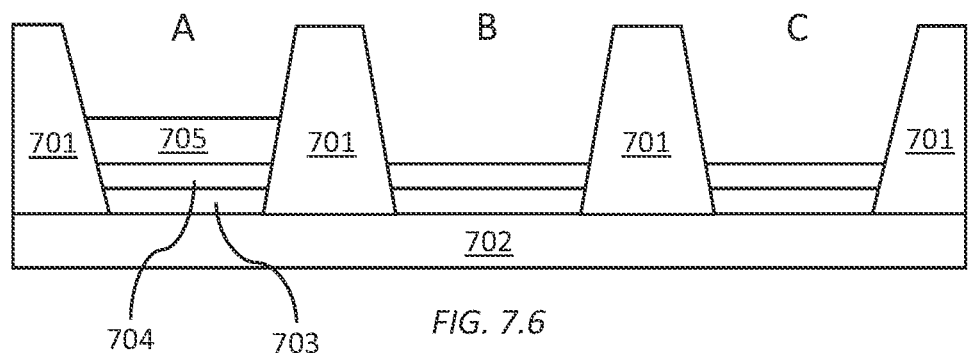
FIG. 7.6

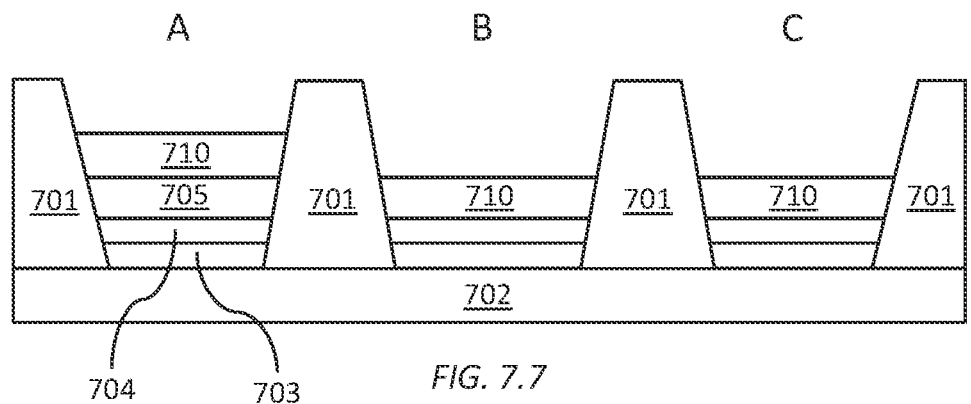
FIG. 7.7
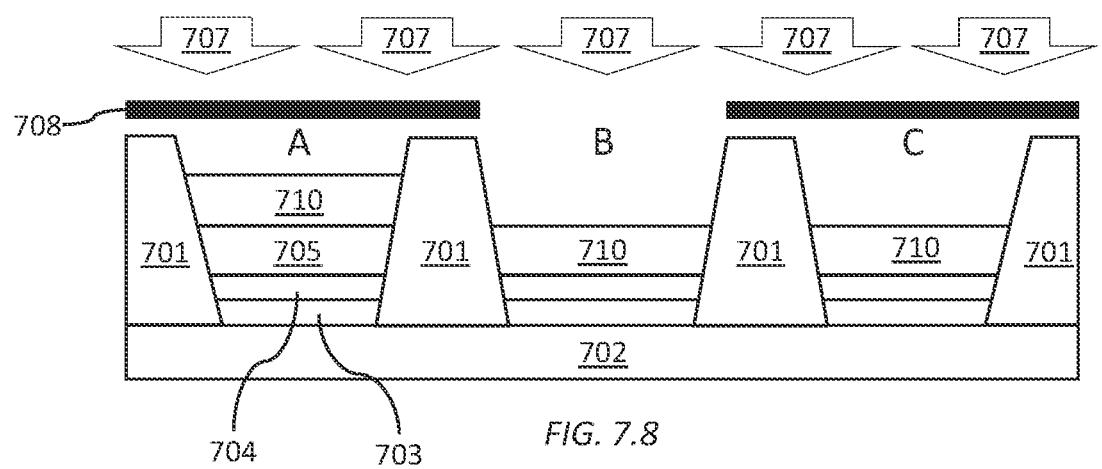
FIG. 7.8
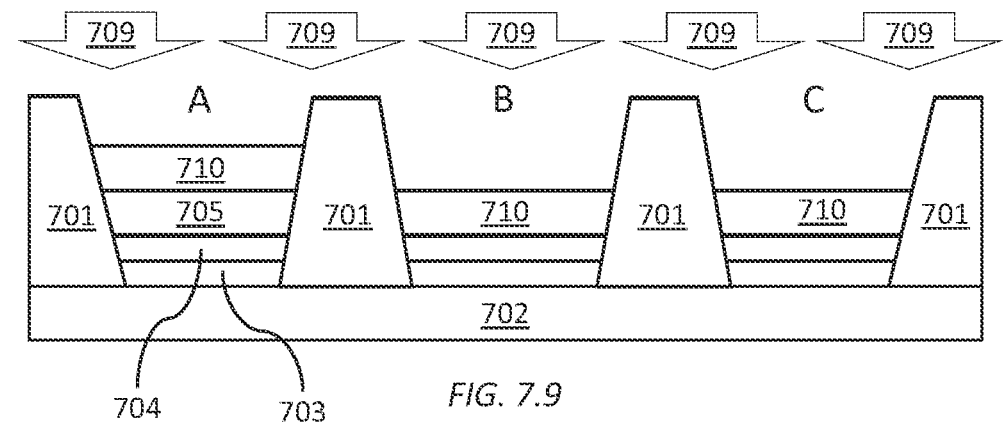
FIG. 7.9

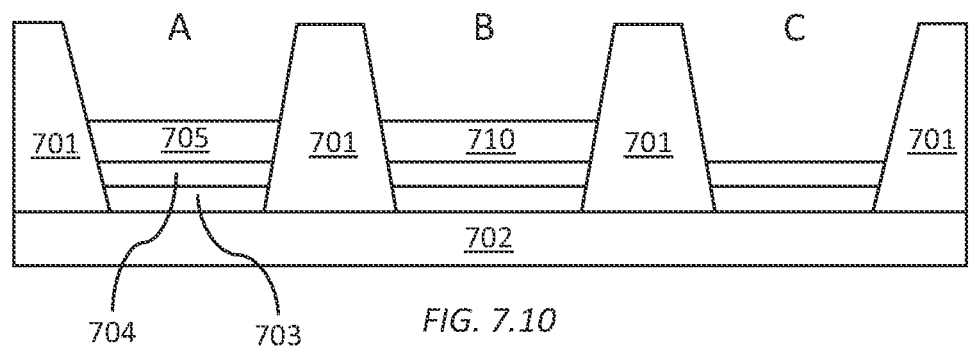
FIG. 7.10
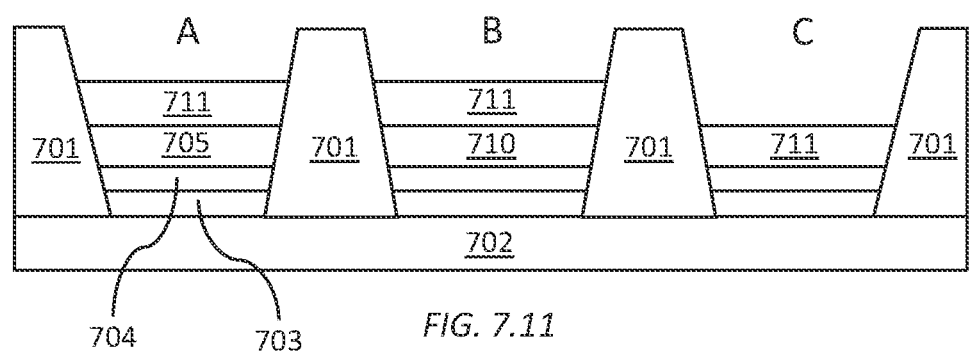
FIG. 7.11
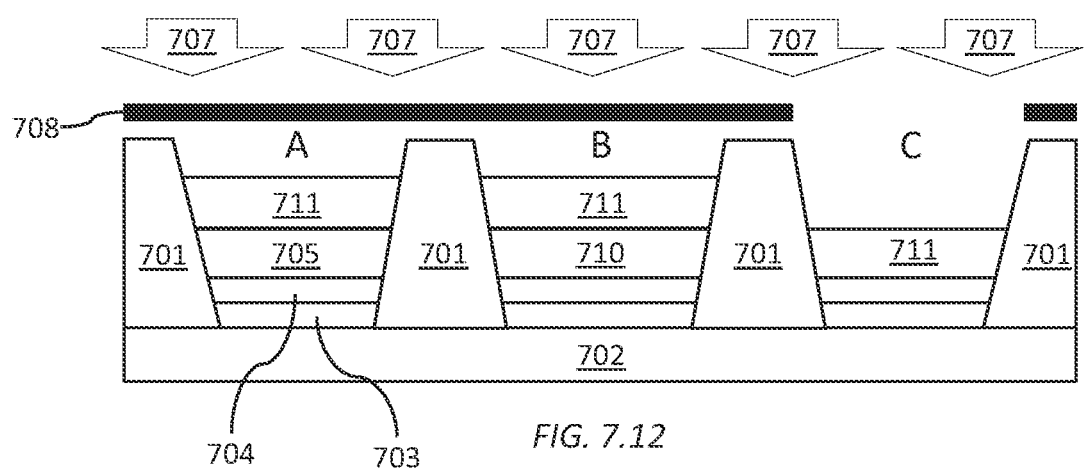
FIG. 7.12

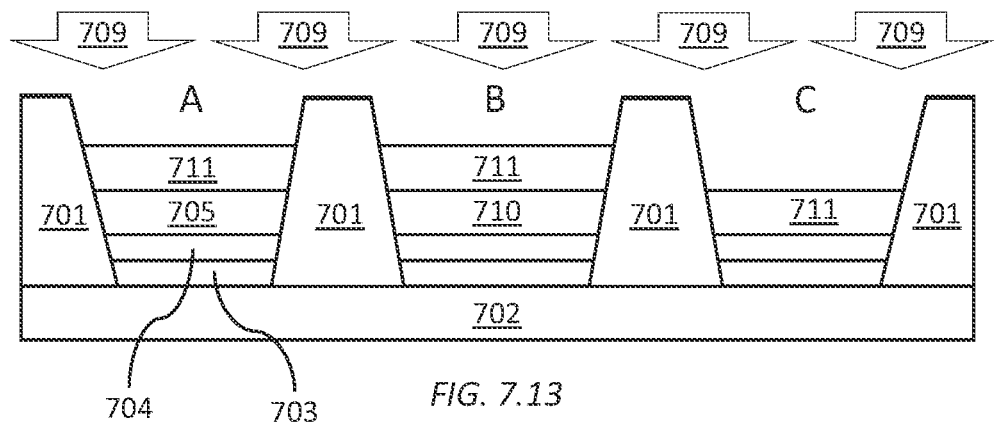
FIG. 7.13
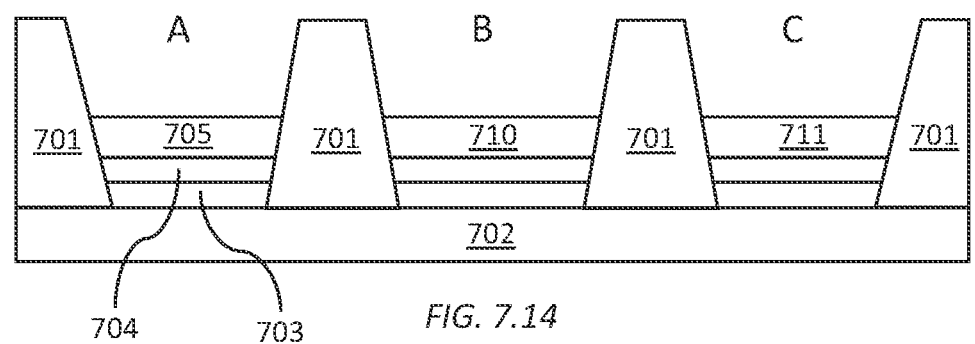
FIG. 7.14
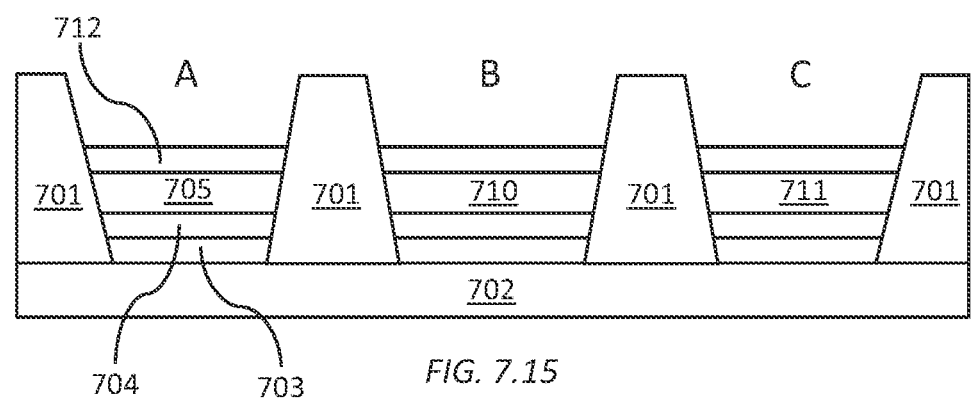
FIG. 7.15

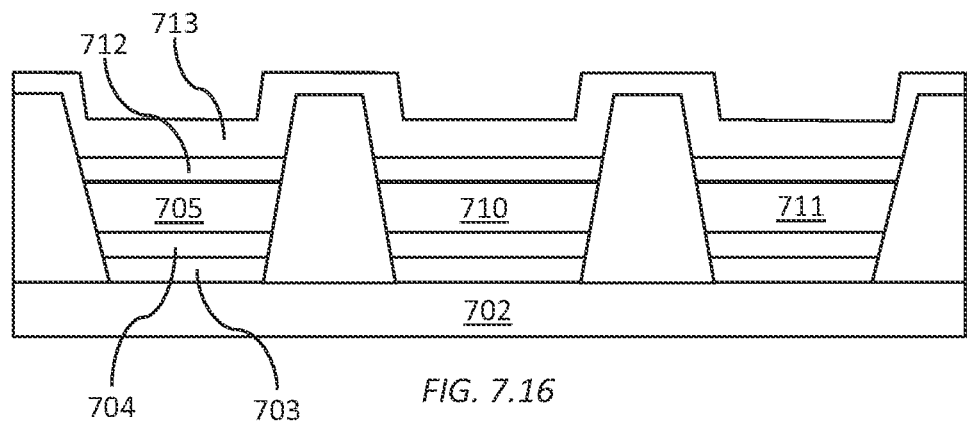
FIG. 7.16
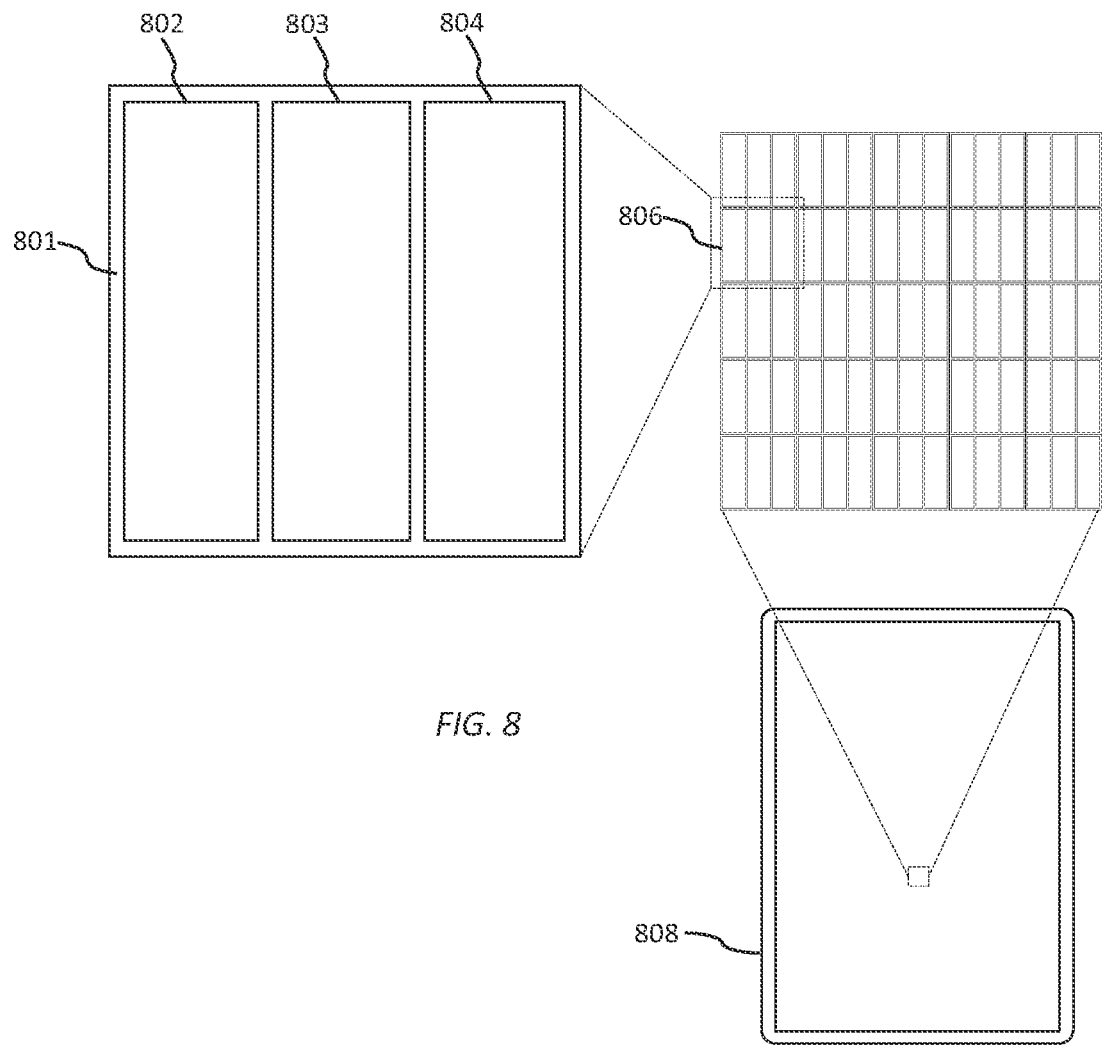
FIG. 8

COMBINED CHARGE TRANSPORTING AND EMITTING LAYER WITH IMPROVED MORPHOLOGY AND BALANCED CHARGE TRANSPORTING PROPERTIES

FIELD

The present disclosure is related to a layer structure used for an emissive apparatus, such as a quantum dot light-emitting diode (QLED). In particular, the present disclosure seeks to describe a QLED structure for patterned apparatuses with improved morphology of the emissive-charge transporting interface and improved charge balance.

BACKGROUND

A common architecture for a light-emitting apparatus includes an anode, which acts as hole injector; a hole transport layer disposed on the anode; an emissive material layer disposed on the hole transport layer; an electron transport layer disposed on the emissive material layer; and a cathode, which also acts as an electron injector, disposed on the electron transport layer. When a forward bias is applied between the anode and cathode, holes and electrons are transported in the apparatus through the hole transport layer and electron transport layer, respectively. The holes and electrons recombine in the emissive material layer, which generates light that is emitted from the apparatus. When the emissive material layer includes an organic material, the light-emitting apparatus is referred to as an organic light-emitting diode (OLED). When the emissive material layer includes nanoparticles, sometimes known as quantum dots (QDs), the apparatus is commonly referred to as either a quantum dot light-emitting diode (QLED, QD-LED) or an electroluminescent quantum dot light-emitting diode (ELQLED, QDEL).

These layers are deposited on a substrate and it is possible to have different structures based on the order of deposition of the layers. In a standard structure the first layer deposited on the substrate is the anode, followed by the hole transporting layer, the emissive layer, the electron transporting layer and finally by the cathode. In an inverted structure, these layers are deposited on the substrate on the opposite order, starting with the cathode and finishing with the anode.

Each of the layers of the light-emitting apparatus can be deposited by different methods with the common methods including thermal evaporation methods and solution process methods. Thermal evaporation methods are widely used for OLEDs, but they are more complex and have higher costs of fabrication as compared to solution process methods. Solution process methods are thus preferred as a cheaper and simpler fabrication methods. However, in the fabrication of apparatuses with these methods, it is important to find the appropriate solvents such that during the deposition of a particular layer, the process will not dissolve or otherwise damage the previously deposited layer. Such a non-damaging solvent is typically referred to in the art as "orthogonal" to the previous one (See, http://dx.doi.org/10.1016/j.orgel.2015.12.008; Gaiwad, Abhinay M., et al. "Identifying orthogonal solvents for solution processed organic transistors" *Organic Electronics,* 2016).

To include QLEDs in multicolor high resolution displays, different manufacturing methods have been designed. These methods typically include depositing three different types of QDs on three different regions of a substrate such that each region emits light (through electrical injection; i.e. by electroluminescence) at three different colors, particularly red (R), green (G) and blue (B). Sub-pixels that respectively emit red, green, or blue light may collectively form a pixel, which in turn may be a part of an array of pixels of the display.

Angioni et al. (U.S. Pat. No. 10,581,007 B2) shows a structure for patterned QLEDs. The structure involve an anode, a cathode and an emissive layer disposed between the anode and the cathode, the emissive layer comprising quantum dots comprising ligands, the quantum dots dispersed in a crosslinked matrix formed at least partially from one or more crosslinkable charge transport materials other than the ligands. This layer forms a combined charge transporting and emitting layer that can be patterned in specific areas of a substrate. This invention can be used to create multicolor high resolution displays, patterning QLED structures with three different colors, particularly red (R), green (G) and blue (B).

In this structure, the morphology of the resulting layer is not ideal, with concave and convex areas due to the intrinsic properties of the QDs. In fact, having high surface area, they tend to minimize they surface free energy phase separating on the upper outer surface of the layer and self-assembling into hexagonal close-packed (hcp) arrays as they seek their equilibrium conformation, coarsening via a combination of Ostwald ripening and cluster diffusion, depending on the stage of coarsening and the initial QD concentration (DOI: 10.1002/adfm.200400468; Coe-Sullivan et al., Large-Area Ordered Quantum-Dot Monolayers via Phase Separation During Spin-Casting, Adv. Funct. Mater. 2005, 15, 1117-1124).

It is known that the hole mobility is usually lower than that of electron in QLEDs (DOI:10.1038/nature13829, Dai et al., Nature, 2014, 515, 96-99).

Recent studies in OLEDs (DOI: 10.1002/adfm.201901025; Tsai et al., Solution-Processed Thermally Activated Delayed Fluorescent OLED with High EQE as 31% Using High Triplet Energy Crosslinkable Hole Transport Materials. Adv. Funct. Mater., 2019, 29, 1901025) and QLEDs (DOI: 10.1002/adma.201801387; Zhang et al., High-Performance, Solution-Processed, and Insulating-Layer-Free Light-Emitting Diodes Based on Colloidal Quantum Dots, Adv. Mater. 2018, 30, 1801387) have indicated that double or blended HTL structures with a stepwise HOMO energy level alignment could benefit the hole transport at interfaces in order to balance this.

Tang et al. (DOI: 10.1021/acsami.0c01001, Realizing 22.3% EQE and 7-Fold Lifetime Enhancement in QLED: via Blending Polymer TFB and Crosslinkable Small Molecule for Solvent-Resistant Hole Transport Layer) take a step further. In this TFB and crosslinkable small molecules are mixed and deposited together in order to create a HTL with improved hole transporting properties and solvent resistance.

Other approaches consist in the inclusion of thin layers of an insulating material within the QDs emissive layer in a layer by layer multilayer structure (DOI: 10.1002/adfm.201906742; Rahmati et al., Highly Efficient Quantum Dot Light-Emitting Diodes by Inserting Multiple Poly(m-ethyl methacrylate) as Electron-Blocking Layers Adv. Funct. Mater. 2019, 1906742) or the inclusion of a thin layer of an insulating material between the QDs emissive layer and the electron transporting layer (Dai et al., Id.).

CITATION LIST

Gaiwad, Abhinay M., et al. "Identifying orthogonal solvents for solution processed organic transistors," *Organic Electronics,* vol. 30, 2016, pp. 18-29 (https://doi.org/10.1016/j.orgel.2015.12.008).

Angioni et al., "Crosslinked emissive layer containing quantum dots for light-emitting device and method for making same," U.S. Pat. No. 10,581,007 (2020).

Coe-Sullivan, S., et al., "Large-Area Ordered Quantum-Dot Monolayers via Phase Separation During Spin-Casting," *Adv. Funct. Mater.*, vol. 15, no. 7, 2005, pp. 1117-1124 (https://doi.org/10.1002/adfm.200400468).

Dai, Xingliang, et al., "Solution-processed, high-performance light-emitting diodes based on quantum dots," *Nature*, vol. 515, 2014, pp. 96-99 (https://doi.org/101038/nature13829).

Tsai, Kuen-Wei, et al., "Solution-Processed Thermally Activated Delayed Fluorescent OLED with High EQE as 31% Using High Triplet Energy Crosslinkable Hole Transport Materials," *Adv. Funct. Mater.*, vol. 29, no. 15, 2019, 1901025 (https://doi.org/10.1002/adfm.201901025).

Zhang, Zhenxing, et al., "High-Performance, Solution-Processed, and Insulating-Layer-Free Light-Emitting Diodes Based on Colloidal Quantum Dots," *Adv. Mater.*, vol. 30, no. 28, 2018, 1801387 (https://doi.org/10.1002/adma.201801387).

Tang, Pengyu, et al., "Realizing 22.3% EQE and 7-Fold Lifetime Enhancement in QLED: via Blending Polymer TFB and Cross-linkable Small Molecule for Solvent-Resistant Hole Transport Layer," *ACS Appl. Mater. Interfaces*, vol. 12, no. 11, 2020, pp. 13087-13095 (https://doi.org/10.1021/acsami.0c01001).

Rahmati, Mohammad, et al., "Highly Efficient Quantum Dot Light-Emitting Diodes by Inserting Multiple Poly(methyl methacrylate) as Electron-Blocking Layers," *Adv. Funct. Mater.*, vol. 29, no. 50, 2019, 1906742 (https://doi.org/10.1002/adfm.201906742).

SUMMARY

A light-emitting apparatus is disclosed, the light-emitting apparatus having an anode, a cathode, and a combined charge transport and emissive layer disposed between the anode and the cathode. The combined charge transport and emissive layer comprises quantum dots (QDs) with ligands, and nanoparticles smaller than the QDs. The QDs and the nanoparticles are dispersed in a crosslinked matrix formed at least partially from at least one crosslinkable charge transport material other than the ligands.

The combined charge transporting and emissive layer is preferably arranged such that the QDs and the nanoparticles are phase segregated in an upper outer surface of the at least one crosslinkable charge transport material, with the nanoparticles arranged closer to the upper outer surface than the QDs. The at least one crosslinkable charge transport material may include one or more functional groups comprising an epoxide, an oxetane, an alkane, an alkene, an alkyne, a thiol, an aldehyde, a ketone, a carboxyl, a methacrylate, an acrylate or an azide.

The ligands of the QDs have one or more functional groups, and the one or more functional groups of the ligands of the QDs comprise an epoxide or an oxetane or an alkane or an alkene or an alkyne or a thiol or an aldehyde or a ketone or a carboxyl, a methacrylate, an acrylate or an azide. The combined charge transport and emissive layer may also further comprise one or more initiators. The at least one of the combined charge transport and emissive layer and one or more interlayers may further comprise one or more photoinitiators. Additionally, the at least one crosslinkable charge transport material comprises one or more hole transport materials.

The light-emitting apparatus may further comprise one or more hole transport or injection layers disposed between the anode and the combined charge transport and emissive layer. The light-emitting apparatus may also further comprise one or more electron transport or injection layers disposed between the cathode and the combined charge transport and emissive layer. The at least one crosslinkable charge transport materials may also comprise at least one of a tertiary, secondary, or primary aromatic or aliphatic amine.

In another implementation, a light-emitting structure includes a substrate and a plurality of sub-pixel structures over the substrate. At least one of the plurality of sub-pixel structures includes an anode, a cathode, and a combined charge transport and emissive layer disposed between the anode and the cathode. The combined charge transport and emissive layer comprises QDs with ligands, and nanoparticles smaller than the QDs. The QDs and the nanoparticles are dispersed in a crosslinked matrix formed at least partially from at least one crosslinkable charge transport material other than the ligands, and the combined charge transport and emissive layer is arranged with the QDs and the nanoparticles phase segregated in an upper outer surface of the crosslinkable charge transport material, with the nanoparticles arranged closer to the upper outer surface than the QDs.

The at least one of the plurality of sub-pixel structures may further comprise one or more electron injecting or transporting layers between the cathode and the combined charge transport and emissive layer, and one or more hole injecting or transporting layers between the anode and the combined charge transport and emissive layer.

The at least one crosslinkable charge transport material may include one or more functional groups comprising an epoxide, an oxetane, an alkane, an alkene, an alkyne, a thiol, an aldehyde, a ketone, a carboxyl, a methacrylate, an acrylate or an azide. Also, the ligands may have at least one functional group needed to bind to the QDs. This can be; a thiol, an amine, a carboxylic acid, a phosphine, and the like. The ligands may then have a second functional group needed to crosslink, this may be; an epoxide, an oxetane, an alkane, an alkene, an alkyne, a thiol, an aldehyde, a ketone, a carboxyl, a methacrylate, an acrylate or an azide.

The combined charge transport and emissive layer may further comprise one or more initiators. The at least one of the combined charge transport and emissive layer and one or more interlayers may further comprise one or more photoinitiators. The at least one crosslinkable charge transport material may comprise one or more hole transport materials. The at least one crosslinkable charge transport materials may comprise at least one of a tertiary, secondary, or primary aromatic and an aliphatic amine.

BRIEF DESCRIPTION OF THE DRAWINGS

Aspects of the exemplary disclosure are best understood from the following detailed description when read with the accompanying figures. Various features are not drawn to scale, dimensions of various features may be arbitrarily increased or reduced for clarity of discussion.

FIG. 1.1 is a first illustration of a two-dimensional schematic representation of a core-shell quantum dot (QD).

FIG. 1.2 is a second illustration of a two-dimensional schematic representation of a core-shell quantum dot (QD).

FIG. 2 illustrates the basic structure of a quantum dot light emitting diode (QLED) in an elevation view.

FIG. 3.1 illustrates the layers of a standard QLED structure in an elevation view.

FIG. 3.2 illustrates the layers of an inverted QLED structure in an elevation view.

FIG. 4.1 illustrates a related art patterned QLED.

FIG. 4.2 illustrates a patterned QLED, showing an uneven QD dispersal.

FIG. 4.3 illustrates a patterned QLED, including QDs and nanoparticles in a monolayer.

FIG. 5.1 illustrates a diagram with the energy levels for the constituents of a QLED having a standard structure.

FIG. 5.2A illustrates a diagram with the energy levels for the constituents of a QLED according to FIG. 4.1.

FIG. 5.2B illustrates a diagram with the energy levels for the constituents of a QLED according to FIG. 4.2.

FIG. 5.3 illustrates a diagram with the energy levels for the constituents of a QLED according to FIG. 4.3.

FIG. 6.1 illustrates a mixture of a crosslinkable hole transporting material, QDs, and nanoparticles.

FIG. 6.2 illustrates a layer of crosslinked hole transporting material, QDs, and nanoparticles.

FIG. 6.3 illustrates the layer of crosslinked hole transporting material, QDs, and nanoparticles after rinsing.

FIG. 7.1 illustrates an elevation view of a QLED manufacturing process in which an anode is deposited on top of a substrate.

FIG. 7.2 illustrates an elevation view of a QLED manufacturing process in which at least one hole injecting/transporting layer (HIL/HTL) is deposited on the anode.

FIG. 7.3 illustrates an elevation view of a QLED manufacturing process in which a first combined hole transporting and emissive layer (CHTEL) layer is deposited.

FIG. 7.4 illustrates an elevation view of a QLED manufacturing process in which the first CHTEL layer is exposed to UV light only in a first area of the substrate.

FIG. 7.5 illustrates an elevation view of a QLED manufacturing process in which the deposited first CHTEL layer is rinsed with a solvent or developer.

FIG. 7.6 illustrates an elevation view of a QLED manufacturing process in which the first CHTEL layer remains only in the first area.

FIG. 7.7 illustrates an elevation view of a QLED manufacturing process in which a second CHTEL layer is deposited.

FIG. 7.8 illustrates an elevation view of a QLED manufacturing process in which the second CHTEL layer is exposed to UV light only in a second area of the substrate.

FIG. 7.9 illustrates an elevation view of a QLED manufacturing process wherein the deposited second CHTEL layer is rinsed with a solvent or developer.

FIG. 7.10 illustrates an elevation view of a QLED manufacturing process in which the second CHTEL layer remains only in the second area.

FIG. 7.11 illustrates an elevation view of a QLED manufacturing process in which a third CHTEL layer is deposited.

FIG. 7.12 illustrates an elevation view of a QLED manufacturing process in which the third CHTEL layer is exposed to UV light only in a third area of the substrate.

FIG. 7.13 illustrates an elevation view of a QLED manufacturing process in which the deposited third CHTEL layer is rinsed with a solvent or developer.

FIG. 7.14 illustrates an elevation view of a QLED manufacturing process in which the third CHTEL layer remains only in the third area.

FIG. 7.15 illustrates an elevation view of a QLED manufacturing process in which an electron transporting layer (ETL) is deposited.

FIG. 7.16 illustrates an elevation view of a QLED manufacturing process in which a cathode layer is deposited to create three independent QLED sub-pixels.

FIG. 8 illustrates a top view of three QLED sub-pixels incorporated into a pixel, and further incorporated into a display.

DESCRIPTION

Figure 9:
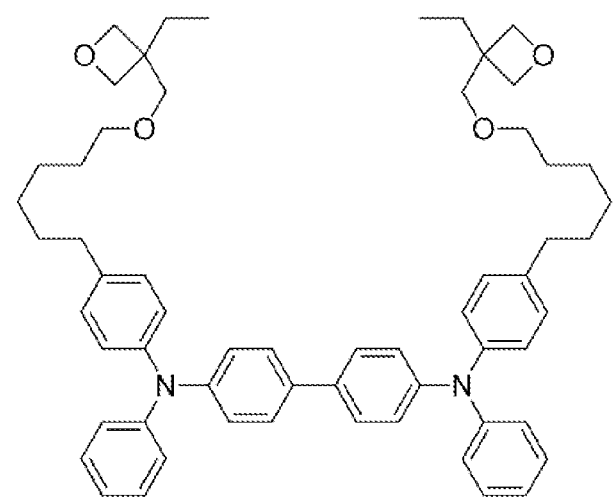
FIG. 9 illustrates the crosslinkable material N4,N4'-Bis (4-(6-((3-ethyloxetan-3-yl)methoxy)hexyl)phenyl)-N4,N4'-diphenylbiphenyl-4,4'-diamine (OTPD).

The following description contains specific information pertaining to exemplary implementations of the present disclosure. The drawings in the present disclosure and their accompanying detailed description are directed to merely exemplary implementations. However, the present disclosure is not limited to merely these exemplary implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For consistency and ease of understanding, like features are identified (although, in some examples, not shown) by numerals in the exemplary figures. However, the features in different implementations may differ in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates an open-ended inclusion or membership in the so-described combination, group, series and the equivalent.

Additionally, for purposes of explanation and non-limitation, specific details, such as functional entities, techniques, protocols, standards, and the like are set forth for providing an understanding of the described technology. In other examples, detailed description of well-known methods, technologies, system, architectures, and the like are omitted so as not to obscure the description with unnecessary details.

Disclosed is a specific structure of a quantum dot light emitting diode (QLED), a method to achieve it and a fabrication method to achieve multicolor high resolution displays based on QLEDs with this structure.

Referring to FIGS. 1.1 and 1.2, a two-dimensional schematic representation of a core-shell quantum dot (QD) is depicted as may be employed in an emissive layer. Quantum dots are defined as particles with a physical radius which is smaller than the exciton Bohr radius. The quantum dots may be configured as nanoparticles. A nanocrystalline core 101 is co-crystalized with a shell of a compatible material 102, which is then surrounded by ligands 103 that passivate crystal defects in the core-shell QD and allow and improve solubility in common solvents. FIG. 1.2 illustrates a schematic simplified version of FIG. 1.1 used for more convenient representation of QDs in a light-emitting apparatus structure, depicting a generalized core-shell QD structure 104 surrounded by a region of ligands 103.

It will be appreciated that while the present disclosure primarily describes the quantum dots as core-shell quantum dots, in some implementations the quantum dots may not be of the core-shell type or they may be of a core/multiple-shells type having more than one shell. The non-core-shell type quantum dots may be made from one or more of the above-mentioned materials, and the quantum dots in accordance with the present disclosure may not include a core-shell configuration.

Referring to FIG. 2, a basic structure of a QLED 200 is illustrated. A first electrode 202 is arranged on a substrate 201, with a second electrode 206 arranged opposite the first electrode 202 on the same side of the substrate 201. An emissive layer (EML) 204, which contains quantum dots (not shown), is arranged between the first electrode 202 and the second electrode 206, and is in electrical contact with the first electrode 202 and the second electrode 206.

A first additional layer 203, and a second additional layer 205 may be present between the first electrode 202, the second electrode 206, and the EML 204, such as one or more charge injection layers, charge transport layers and charge blocking layers. In a standard (or non-inverted) structure (as shown in FIG. 3.1) the electrode closer to the substrate (i.e., the first electrode 202) is an anode and any layers between the anode and the EML 204 are hole injection layers, hole transporting layers, electron blocking layers or hole blocking layers, together referred to as layers 203.

Similarly, the electrode further from the substrate (i.e., the second electrode 206) is a cathode and any layers between the cathode and the EML 204 are electron injection layers, electron transporting layers, hole blocking layers or electron blocking layers, together referred to as layers 205. The positions of the anode and cathode, along with all injection, transport and blocking layers 203, 205, may be reversed, in which case the apparatus is said to have an inverted structure (as shown in FIG. 3.2).

FIG. 3.1 illustrates the layers of a standard (or non-inverted) QLED 300, including the polarity of an electronic circuit applied thereto. The standard QLED 300 includes a substrate 301, with an anode layer 302 formed on the substrate 301. A hole transporting layer(s) 303 is formed on the anode layer 302. An EML 304 (including QDs) is formed on the hole transporting layer(s) 303. An electron transporting layer(s) 305 is formed on the EML 304, and a cathode layer 306 is formed over the electron transporting layer(s) 305.

FIG. 3.2 illustrates the layers of an inverted QLED 307, including the polarity of an electronic circuit applied thereto. The inverted QLED 307 includes a substrate 301, with a cathode layer 306 formed on the substrate 301. An electron transporting layer(s) 305 is formed on the cathode layer 306. An EML 304 (including QDs) is formed on the electron transporting layer(s) 305. A hole transporting layer(s) 303 is formed on the EML 304, and an anode layer 302 is formed over the hole transporting layer(s) 303.

Referring to FIG. 4.1 a standard top emitting QLED structure 400 is shown as per an implementation in Angioni et al. (U.S. Pat. No. 10,581,007). The QLED structure 400 comprises various layers sandwiched between two electrodes, deposited in the following order: an anode layer 402 is deposited on a substrate 401, a hole injection layer (HIL) 403 is deposited on the anode layer 402, a combined hole transporting and emissive layer (CHTEL) 404 is deposited on the HIL 403, an electron transporting layer (ETL) 405 is deposited on the CHTEL 404 and a cathode layer 406 is deposited on the ETL 405.

The CHTEL 404 comprises a series of quantum dots 407, dispersed and mainly phase segregated as monolayer on the upper outer surface of a crosslinkable hole transporting material 408 that makes them patternable and resistant to solvent rinsing. Electron mobility 410 from the cathode layer 406, and hole mobility 409 from the anode layer 402 are shown moving toward the CHTEL 404 to produce luminance. In practice, the morphology of the resulting CHTEL 404 as shown in FIG. 4.1 is not always ideal.

Referring to FIG. 4.2, a more realistic representation of the CHTEL 404 is illustrated, where the QDs 411 are not distributed as a uniform monolayer, and the outer upper surface of the CHTEL 404 is rough (uneven), forming concave areas 412 and convex areas 413 due to the intrinsic properties of the QDs.

Furthermore, the structure shown in FIG. 4.2 (and FIG. 4.1) reflects the imbalance of the hole mobility 409 and the electron mobility 410, with the hole mobility 409 being lower than the electron mobility 410. This kind of structure has even lower hole mobility 409 compared with a QLED structure with the emissive layer deposited from colloidal QDs, because the hole transporting material is surrounded by QDs, making the transport of charge carriers even less efficient than in a pure material. In this kind of structure, the lower hole mobility 409, is affected because the hole transporting material surrounds the QDs. This has a negative effect because the hole transporting material can directly contact the electron transporting layer creating non-radiative pathways. However, at the same time it has positive effect because the holes are transported more effectively to the QDs.

Referring to FIG. 4.3, in order to improve the morphology of the CHTEL 404 and simultaneously improve the hole mobility 409/electron mobility 410 balance (and consequently the performance of the apparatuses created with this kind of structure), a strategy has been developed involving the deposition of a CHTEL 404 that includes nanoparticles 415 of a different size (e.g., smaller) than the QDs 414. This has the dual effect of leveling the CHTEL 404 creating a flatter surface on which to deposit the ETL 405 and to provide a thin layer that can be engineered in order to control the balance of holes and electrons injected in the QDs (i.e., hole mobility 409 and electron mobility 410).

Referring to FIG. 5.1, a first diagram 500 of an QLED apparatus is shown illustrating the energy levels of the different constituents of the QLED, having a standard structure as is known in the related art. The constituent layers include an anode layer 501, an HIL 502, an HTL 503, an EML 504, an ETL 505 and a cathode layer 506.

Referring to FIG. 5.2A, a second diagram 510 of the QLED apparatus of FIG. 4.1 is shown illustrating the energy levels of the different constituents of the QLED having a standard structure as is known in the related art. The constituent layers include an anode layer 501, an HIL 502, a CHTEL 507A composed of quantum dots 504A dispersed and mainly phase segregated on the top of a crosslinkable hole transporting material of an HTL 503, an ETL 505 and a cathode layer 506.

Referring to FIG. 5.2B, a third diagram 511 of the QLED apparatus of FIG. 4.2 is shown illustrating the energy levels of the different constituents of the QLED having a standard structure as is known in the related art. The constituent layers include an anode layer 501, an HIL 502, a CHTEL 507B composed of quantum dots 504B dispersed and mainly phase segregated on the top of a crosslinkable hole transporting material of an HTL 503, an ETL 505 and a cathode layer 506. In this case the ETL 505 is partially surrounding the QDs, and thus is much closer to the crosslinkable hole transporting material. In this structure, there may be non-radiative pathways that go directly from the ETL 505 to the crosslinkable hole transporting material of the HTL 503, thereby decreasing the overall performance of the apparatus.

Referring to FIG. 5.3, a fourth diagram 512 of the QLED apparatus of FIG. 4.3 is shown illustrating the energy levels of different constituents of the QLED having a standard structure. The constituent layers include an anode layer 501, an HIL 502, a CHTEL 507C, an ETL 505 and a cathode layer 506. The CHTEL 507C is composed of QDs 504C and smaller nanoparticles 509, both dispersed and mainly phase segregated on the top of a mixture of a crosslinkable hole transporting material of an HTL 503, with the order described in FIG. 4.3 (i.e., smaller nanoparticles 509 on top of the larger QDs 504C).

In these three QLED structures (FIGS. 5.1, 5.2A, 5.2B, 5.3), when a positive bias is applied to the apparatus, holes 508 and electrons 513 travel as depicted by the dotted arrows, and they meet at the QDs where they recombine and emit light. In the apparatus depicted in FIG. 5.1 the holes 508 and electrons 513 have to travel passing through the different layers, encountering differences in energies and mobility from the different materials. In the structure depicted in FIG. 5.2A there is an improvement in the path of for the holes 508. For example, the hole transporting material is now crosslinked and disperses the QDs 504A. This makes these two materials more interconnected improving the transport of holes into the QDs 504A.

In the apparatus depicted in FIG. 5.2B the improvement described in FIG. 5.2A is worsened by the fact that the morphology of the CHTEL 507B is not ideal but it is more like as depicted in FIG. 4.2. This brings the ETL 505 closer to the crosslinkable hole transporting material, increasing the chance of non-radiative pathways between these two layer and then decreasing the performances of the apparatus.

In the apparatus depicted in FIG. 5.3, the non-radiative pathways between the ETL 505 and the crosslinkable hole transporting material of the HTL 503 are partially blocked by the thin layer of the smaller nanoparticles 509. In this structure, the injection of electrons 513 into the QDs is decreased.

The benefits of the structure shown in FIG. 5.3 depend on:
(1) Absolute and relative energy levels of the HTL 503, QDS of EML 504, ETL 505 and smaller nanoparticles 509 materials. Considering energy levels as depicted as in FIGS. 5.2A and 5.2B, the smaller nanoparticles 509 should have conduction energy level higher than that of the ETL 505. The larger this difference in energy is, the larger will be the capacity of smaller nanoparticles 509 to block electrons, and the less efficiently the electrons will be injected into the QDs.
(2) The size of the smaller nanoparticles 509. In general, with the same formulation of smaller nanoparticles 509, decreasing the size of the smaller nanoparticles 509, the band gap increases and thus the conduction band increases in energy.
(3) The mobility of smaller nanoparticles 509.
(4) The cross-linkability of the HTM-QDs-NP layer (e.g., the CHTEL 404 in FIG. 4.3).

Referring to FIG. 6.1, a mixture of a crosslinkable hole transporting material 602, QDs 603 and nanoparticles 604 is shown, with the nanoparticles 604 being smaller than the QDs 603.

Referring to FIG. 6.2, in a deposition and cross-linking action, the transporting material 602, QDs 603, and nanoparticles 604 are deposited in a layer on top of a substrate 601. The layer is then crosslinked using an activation stimulus and the three components arrange as depicted, with most of the crosslinked hole transporting material 609 in contact (e.g., direct contact) with the substrate 601, then the QDs 603, and the nanoparticles 604 at top, both being surrounded by the remaining crosslinked material 609. This configuration obtains a layer where the three components (hole transporting material 609, QDs 603, and nanoparticles 604) are crosslinked together and are resistant to solvent (or developer) rinsing. This layer has a thickness of x nm and its morphology is not ideal with high roughness ($R_q$>5 nm), characterized by deep cracks 605 in the surface of the layer. The deep cracks 605, also have a secondary negative aspect, by making the top surface of the layer more prone to solubility in a solvent or developer (i.e., the crosslinked charge transporting material 609 does not fully surround the exposed nanoparticles 604).

Referring to FIG. 6.3, in a development action, the CHTEL 607 in FIG. 6.2 is rinsed with a solvent or developer, and a superficial portion of the CHTEL 607 of y nm it is washed away. The resulting CHTEL 608 has a surface with better morphology with smaller, shallow cracks 606 and lower roughness. The thickness of the CHTEL 608 depicted in FIG. 6.3 is the difference between x and y (i.e., x−y), where y is between 0 and 20% of x, or between 0 and 10% of x, or between 0 and 5% of x. The $R_q$ roughness parameter of the surface of the CHTEL 607 in FIG. 6.2 is more than 5 nm, while the $R_q$ for the surface of the CHTEL 608 depicted in FIG. 6.3 is between 5 and 0.1 nm, or between 4 and 0.1 nm, or between 2 and 0.1 nm. Surface roughness (often shortened to 'roughness'), is a component of surface texture. It is quantified by the deviations in the direction of the normal vector of a real surface from its ideal form. If these deviations are large, the surface is rough; if they are small, the surface is smooth. The root mean squared roughness ($R_q$) is a parameter that describes the roughness. If $R_q$ is high, the surface is rough; if it is low, the surface is smooth.

The fact that the deposited and crosslinked CHTEL 607 in FIG. 6.2 can be crosslinked with an external stimuli, means that it can be patterned on a specific area of the apparatus. This aspect is of particular importance in order to include QLEDs with this structure in multicolor high resolution displays. As described above and as further described later in this disclosure, for implementations of this invention, three different types of QDs on three different regions of a substrate should be deposited such that each region emits light (through electrical injection or electroluminescence) at three different colors, particularly red (R), green (G) and blue (B). Sub-pixels that respectively emit red, green, or blue light may collectively form a pixel, which in turn may be a part of an array of pixels of the display. In fact, different nanoparticle materials or different nanoparticle sizes can be used for the three different colors, depending on the energy levels and on the sizes of the different QDs used and of the different crosslinkable material (e.g., the transporting material 602). Furthermore, the nanoparticles 604 can be used as protective barrier for the QDs 603 that have to withstand multiple depositions of other layers and rinsing steps in order to include QLEDs with this structure in multicolor high resolution displays, as described below.

Still referring to FIG. 6.3, the final CHTEL 608 described above has thickness from 10 to 150 nm and it is composed by the QDs 603 (from 1 to 40 wt % of the mixture), the crosslinked charge transporting material (X-HTM) 609 (from 60 to 99 wt % of the mixture) and the nanoparticles 604 (from 1 to 40 wt % of the mixture). In implementations where an initiator of the polymerization (cross-linkage) is included, this has a concentration from 0.01 wt % to 10 wt % of the final layer. The total concentration of materials in the solution used to deposit this layer is between 0.1 to 20 wt % with the solvent being 99.9 to 80 wt %.

Ideal values for the thickness and the composition of the CHTEL 608 layer are: 20-80 nm; QDs 603 (15-20 wt %), X-HTM 609 (50-80 wt %), nanoparticles 604 (5-25 wt %). In various implementations where initiator of the polymerization (cross-linkage) is included, ideal values are 1-3 wt %. The ideal total concentration of materials in the solution used to deposit the CHTEL 607/608 is between 1 to 5 wt % with the solvent being 99 to 95 wt %.

In one implementation, a patternable QLED with nanoparticles much smaller than the QDs in the CHTEL is contemplated. Considering nanoparticles with the same formulation (e.g. ZnO), decreasing the size of the nanoparticles, the band gap increases. For this reason, depending on the QDs 603 size it could be beneficial use different types of nanoparticles 604. According to the present implementation, smaller is the QDs 603 size, smaller should be the nanoparticles 604 size, at least to always respect the rule: QDs 603>nanoparticles 604.

In another implementation, a patternable QLED with nanoparticles with variable composition smaller than the QDs in the CHTEL is contemplated. Considering nanoparticles with three components as $Mg_xZn_{y-x}O$, changing the concentration ratio between two components changes the band gap of the nanoparticles. As shown in recent studies for $Mg_xZn_{y-x}O$ (Coatings 2019, 9(4), 277; DOI: 10.3390/coatings9040277), increasing the content of Magnesium the band gap of the nanoparticles increases. It some implementations, may be beneficial to increase the content of Magnesium and decrease the nanoparticle size in order to achieve a larger energy band gap.

Referring to FIGS. 7.1-7.18, various manufacturing actions are shown in creating RGB patterned QLEDs with a shared interlayer. The method (not to scale) uses the above disclosed structures in order to form three different QLEDs with standard structure on three different regions of a substrate. The three different areas may be sub-pixels that respectively emit light of three different colors and that may collectively form a pixel, which in turn may be a part of an array of pixels of the display. These three structure can share the same nanoparticles in three different CHTELs representing different colors.

Light-emitting apparatuses may be arranged such that the light-emitting apparatuses are separated at least in part by one or more insulating materials. This arrangement may also be referred to as a "bank structure." FIGS. 7.1-7.16 are drawings illustrating a cross-section view of such a bank structure 701 that can allocate multiple light-emitting apparatuses formed in accordance with implementations of the present application. In a specific implementation these areas are three and they are labeled A, B and C in order to distinguish three different sub-pixels. They are formed in these areas by taking, at least the following actions:

FIG. 7.1 shows that an anode layer 703 is deposited on top of a substrate 702 with bank structures 701 shaped in order to accommodate three different sub-pixels (e.g., in areas A, B, and C). The anode can be the same in the three areas or different for each area.

FIG. 7.2 shows that at least one hole injecting/transporting layer (HIL/HTL) 704 is deposited on top of the anode layer 703.

FIG. 7.3 shows that a CHTEL A 705 containing QDs of type A, a crosslinkable HTM and nanoparticles smaller than the QDs is deposited on top of the HIL/HTL 704. This layer can be crosslinked (i.e., polymerized) when exposed to UV light of specific energy.

FIG. 7.4 shows the UV crosslinkable CHTEL A 705 being exposed to UV light 707 only in correspondence of a specific area of the substrate (i.e., area A), delimitated by the use of a shadow mask 708. A crosslinked CHTEL A 705 is obtained in the area A, this area is now resistant to rinsing with a specific solvent or developer.

FIG. 7.5. shows the substrate 702 with the deposited layers (703, 704) being rinsed with a solvent or developer 709 that washes away the CHTEL A 705 that is not in the area A.

FIG. 7.6 shows that in the area A all layers deposited are present (including CHTEL A 705), while in the areas B and C, only the anode layer 703 and the HIL/HTL 704 layer are present.

FIG. 7.7 shows a CHTEL B 710 containing QDs of type B, a crosslinkable HTM and nanoparticles smaller than the QDs deposited on top of the structure represented in FIG. 7.6. In the area A, underneath the CHTEL B 710 are present the CHTEL A 705, the HIL/HTL 704 and the anode 703. In the areas B and C, underneath the CHTEL B 710 are present only the HIL/HTL 704 and the anode 703. CHTEL B 710can be crosslinked (i.e., polymerized) when exposed to UV light of specific energy.

FIG. 7.8. shows the UV crosslinkable CHTEL B 710 exposed to UV light 707 only in correspondence of a specific area of the substrate (i.e., area B), delimitated by the use of a shadow mask 708. A crosslinked CHTEL B 710 is therefore obtained in the area B, and this area is now resistant to rinsing with a specific solvent or developer.

FIG. 7.9 shows the substrate 702 with the deposited layers (703, 704, 705, 710) being rinsed with a solvent or developer 709 that washes away the CHTEL B 710 that is not in the area B.

FIG. 7.10 shows that in the area B are present all layers deposited in FIGS. 7.7 (703, 704 and 710), while in the area A are present only the layers deposited up to FIGS. 7.6 (703, 704 and 705) and in the area C are present only the anode 703 and the hole injecting/transporting layers 704.

FIG. 7.11 shows a CHTEL C 710 containing QDs of type C, a crosslinkable HTM and nanoparticles smaller than the QDs deposited on top of the structure represented in FIG. 7.10. In the area A, underneath the CHTEL C 711 are present the CHTEL A 705, the HIL/HTL 704 and the anode 703. In the area B, underneath the CHTEL C 711 are present the CHTEL B 710, the HIL/HTL 704 and the anode 703. In the area C underneath the CHTEL C 711 are present only the HIL/HTL 704 and the anode 703. CHTEL C 711 can be crosslinked (i.e., polymerized) when exposed to UV light of specific energy.

FIG. 7.12 shows the UV crosslinkable CHTEL C 711 exposed to UV light 707 only in correspondence of a specific area of the substrate (i.e., area C), delimitated by the use of a shadow mask 708. A crosslinked CHTEL C 711 is therefore obtained in the area C, and this area is now resistant to rinsing with a specific solvent or developer.

FIG. 7.13 shows the substrate 702 with the deposited layers (703, 704, 705, 710, 711) being rinsed with a solvent or developer 709 that washes away the CHTEL C 711 that is not in the area C.

FIG. 7.14 shows that in the area C are present all layer deposited in FIGS. 7.11 (703, 704 and 711), in the area B are present only the layers deposited up to FIGS. 7.7 (703, 704 and 710), while in the area A are present only the layers deposited up to FIGS. 7.6 (703, 704 and 705).

FIG. 7.15 shows that an electron transporting layer (ETL) 712 is deposited over CHTEL A 705, CHTEL B 710, and CHTEL C 711, in areas A, B, and C, respectively.

FIG. 7.16 shows that a cathode layer 713 has been deposited over areas A, B, and C, including the bank structures 701, to create three QLED sub-pixels in three different areas (A, B, and C), which may be the colors required for a multi-color display.

FIG. 8 depicts a schematic top view of three different QLEDs structures adjacent to each other in the same substrate in accordance with implementations of the present application, which in turn may be a part of an array of pixels of a display. A bank structure 801 separates a first QLED sub-pixel 802, a second QLED sub-pixel 803, and a third QLED sub-pixel 804, making up a multicolor QLED pixel 806. The multicolor QLED pixel 806, may with an array of other adjacent multicolor structure QLED pixels, form a display incorporated into a display apparatus 808.

The structure and manufacture of the combined charge transporting and emitting layer with improved morphology and balanced charge transporting properties having been shown and described, its exemplary materials will now be discussed.

Substrates

The substrate 201 (FIG. 2) may be made from any suitable material(s) as are typically used in light-emitting apparatuses, such as glass substrates and polymer substrates. More specific examples of substrate materials include polyimides, polyethenes, polyethylenes, polyesters, polycarbonates, polyethersulfones, polypropylenes, and/or polyether ether ketones. The substrate 201 may be any suitable shape and size. In some implementations, the dimensions of the substrate allow for more than one light-emitting apparatus to be provided thereon. In an example, a major surface of the substrate may provide an area for multiple light-emitting apparatuses to be formed as sub-pixels of a pixel, with each sub-pixel emitting light of a different wavelength such as red, green, and blue. In another example, a major surface of the substrate may provide an area for multiple pixels to be formed thereon, each pixel including a sub-pixel arrangement of multiple light-emitting apparatuses.

Deposition Methods

To deposit multiple layers in a typical QLED structure using solution process methods, solution of different materials in adjacent orthogonal solvents should be deposited. Solution process methods include, but are not limited to, methods of drop casting, spin coating, dip coating, slot die coating, spray coating, and inkjet printing.

Electrodes

The first electrode 202 and second electrode 206 (FIG. 2) may be made from any suitable material(s) as are typically used in light-emitting apparatuses. At least one of the electrodes is a transparent or semi-transparent electrode for light emission, and the other of the electrodes is a reflective electrode to reflect any internal light toward the light-emitting side of the apparatus. In the case of a bottom-emitting apparatus, the first electrode 202 will be transparent or semi-transparent. Typical materials for the transparent or semi-transparent electrode include indium-doped tin oxide (ITO), fluorine doped tin oxide (FTO), indium-doped zinc oxide (IZO), aluminum-doped zinc-oxide (AZO), indium-doped cadmium-oxide, and the like. In the case of a top-emitting apparatus, the first electrode 202 may be made of any suitable reflective metal such as silver or aluminum. In bottom-emitting apparatuses, the second electrode 206 is a reflective electrode. Typical materials used for the reflective electrode include metals such as aluminum or silver (cathodes for a standard structure) and gold, aluminum, silver or platinum (anodes for an inverted structure). Top-emitting structures will use a semi-transparent second electrode 206 such as thin (<20 nm) silver, a metallic bilayer (e.g. 2 nm Aluminum/15 nm Silver) or a magnesium-silver alloy. The electrodes 202, 206 may also be provided in any suitable arrangement. As an example, the electrodes 202, 206 may address a thin-film transistor (TFT) circuit.

QDs and Ligands

Exemplary quantum dot core and shell materials include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_xTe_{1-x}$, $ZnSe_xTe_{1-x}$, perovskites of the form $ABX_3$, $Zn_wCu_z$ $In_{1-(w+z)}S$, and carbon, where $0 \leq w, x, y, z \leq 1$. Exemplary ligands 103 include alkyl, -alkenyl, -alkynyl or aryl (linear, branched or cyclic) thiols with 1 to 30 atoms of carbon; alkyl, -alkenyl, -alkynyl or aryl (linear, branched or cyclic) alcohols with 1 to 30 atoms of carbon; alkyl, -alkenyl, -alkynyl or aryl (linear, branched or cyclic) carboxylic acids with 1 to 30 atoms of carbon; tri-alkyl, -alkenyl, -alkynyl or aryl (linear, branched or cyclic) phosphine oxides with 1 to 60 atoms of carbon; alkyl, -alkenyl, -alkynyl or aryl (linear, branched or cyclic) amines with 1 to 30 atoms of carbon; salts formed from any of the above listed compounds (the anion or the cation are the binding moieties); halogen salts (the anion or the cation are the binding moieties). It will be appreciated that while the present disclosure primarily describes the quantum dots as core-shell quantum dots, in some implementations the quantum dots may not be of the core-shell type or they may be of a core/multiple-shells type having more than one shell. The non-core-shell type quantum dots may be made from one or more of the above-mentioned materials, and the quantum dots in accordance with the present disclosure may not include a core-shell configuration.

Solvents and Developer

The solvent or developer used may be any suitable solvent, mixture or solution. For example, the solvent may be selected such that the quantum dots, the crosslinkable material when not polymerised (and the photo initiator, if included) are soluble therein. Exemplary solvents include, but are not limited to, the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 20 atoms of carbon (e.g., butanol, 2-propanol, propanol, ethanol, methanol), linear or branched alkoxy alcohols with 2 to 20 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA), 1-methoxy-2-propanol, water. Exemplary solutions may include any alkaline or acidic material in one or in a mixture of the above mentioned solvents. The particular solvent or developer that is utilized may depend on the specific quantum dots, crosslinkable material, nanoparticles and photo initiator that are selected.

Banks

Exemplary insulating materials for the banks may include, but are not limited to, polyimides. In some examples, the insulating material may include a surface treatment, such as for example fluorine, to modify the insulating material wetting properties. For example, the insulating material may be made hydrophilic to prevent the deposited material from sticking on the banks and to ensure the subpixel is filled properly. The insulating material thus forms wells and the bottoms may include different electrodes (e.g., anodes) for each subpixel.

Photo-Initiators

In some implementations the crosslinked hole transporting layer is formed using one or more photo-initiators. As such, the layer described in this application may include one or more photo-initiators. A photo initiator is a material that initiates polymerization in response to light stimuli. In some implementations, the photo initiator may generate one or more radicals, ions, acids, and/or species that may initiate such polymerization.

In exemplary implementations the initiator is a photo initiator. Example photo initiators include sulfonium- and iodonium- salts (e.g. triphenylsulfonium triflate, diphenyliodonium triflate, iodonium, [4-(octyloxy)phenyl]phenyl hexafluorophosphate, bis(4-methylphenyl)iodonium hexafluorophosphate, diphenyliodonium hexafluoroarsenate, diphenyliodonium hexafluoroantimonate, etc.), chromophores containing the benzoyl group (benzoin ether derivatives, halogenated ketones, dialkoxyacetophenones, diphenylacetophenones, etc), hydroxy alkyl heterocyclic or conjugated ketones, benzophenone- and thioxanthone-moiety-based cleavable systems (such as benzophenone phenyl sulfides, ketosulfoxides, etc), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, Barton's ester derivatives, hydroxamic and thiohydroxamic acids and esters, organoborates, titanocenes, chromium complexes, aluminate complexes, tempo-based alkoxyamines, oxyamines, alkoxyamines, and silyloxyamines.

In some implementations, when the specific area of the deposited layer is exposed to UV light, the photo initiator initiates the polymerization of the crosslinkable material. QDs, ligands of the QDs, crosslinkable material, charge transporting material, and photo-initiator can be selected to create uniform dispersion in the deposition solvent. Materials with similar polarity indexes can be selected to ensure homogeneity of the deposited mixtures.

Electron Transporting/Injecting Materials

In exemplary implementations, the electron transport and/or electron injection layers may include individual or combinations of: ZnO, 8-quinolinolato lithium (Liq.), LiF, $Cs_2CO_3$, $Mg_xZn_{1-x}O$, $Al_xZn_{1-x}O$, 2,2',2''-(1,3,5-benzinetriyl)-tris(1-phenyl-1-H-benzimidazole) (TPBi), TiO2, ZrO2, N4,N4'-Di(naphthalen-1-yl)-N4,N4'-bis(4-vinylphenyl) biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), where $0 \leq x \leq 1$.

Hole Transporting/Injecting Materials

In exemplary implementations, the hole transport and/or hole injection layers may include individual or combinations of: poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl) biphenyl-4,4'-diamine (QUPD), N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), 3,5-di-9H-carbazol-9-yl-N,N-bis[4-[[6-[(3-ethyl-3-oxetanyl)methoxy]hexyl]oxy]phenyl]-benzenamine (Oxe-DCDPA).

Crosslinkable Hole Transporting Materials

The crosslinked material is originated from the polymerization of a crosslinkable organic (or organo-metallic) material.

UV-induced crosslinked charge transport materials include UV-induced crosslinked hole transport materials and/or UV-induced crosslinked electron transport materials. Accordingly, the matrix of one or more UV-induced crosslinked charge transport materials may be formed from one or more types of crosslinkable materials. Such materials include one or more hole transport materials and/or one or more electron transport materials. In some implementations, the crosslinkable hole transport material may be a material which is an effective hole transporter both without and with crosslinking. In other implementations, the crosslinkable hole transport material may be a material which is an effective hole transporter only when crosslinked. In some implementations, the crosslinkable electron transport material may be a material which is an effective electron transporter both without and with crosslinking. In other implementations, the crosslinkable electron transport material may be a material which is an effective electron transporter only when crosslinked. In some implementations, the crosslinked charge transport materials can include one or more of hole injection materials, electron injection materials, hole blocking materials, electron blocking materials, and/or interconnecting materials (ICM).

In some implementations, the crosslinkable material from which the UV-induced crosslinked charge transport material may be formed includes at least two moieties with different characteristics. As an example, one of the at least two moieties of the molecule may provide charge transporting properties and another of the at least two moieties of the molecule may provide UV-cross-linking capabilities. Exemplary moieties that may provide charge transporting properties include, but are not limited to, tertiary, secondary, and primary aromatic or aliphatic amines, heterocyclic amines, tryaryl phosphines, and quinolinolates. Exemplary moieties that may provide UV-cross-linking capabilities include, but are not limited to, oxetane, epoxy, thiol, azide, alkane, alkene, alkyne, acrylate, methacrylate, ketone, and aldehyde units. In some implementations, the two moieties may be connected and between them there may be a distance of less than 20 nm.

In some implementations the mixture of the crosslinkable material with the QDs can include a small molecule co-monomer that can allow polymerization. The co-monomer may contain at least one functional group X that may interact with a functional group Y of the crosslinkable material. The crosslinkable material may include such functional group Y at two or more molecular sites. For example, the functional group X may be at two ends of the co-monomer; the functional groups Y may be at two ends of the crosslinkable material. In one implementation, the functional groups X may be a thiol, and the function groups Y may be an alkene or alkyne, or vice versa.

Ligands of the QDs, co-monomers and crosslinkable materials included in the mixture can be selected to create uniform dispersion in the deposition solvent. Materials with similar polarity indexes can be selected to ensure homogeneity of the deposited mixtures.

One example of a crosslinkable material from which the structure described above may be formed is N4,N4'-Bis(4-(6-((3-ethyloxetan-3-yl)methoxy)hexyl)phenyl)-N4,N4'-diphenylbiphenyl-4,4'-diamine (OTPD), as shown in FIG. 9.

Figure 10:
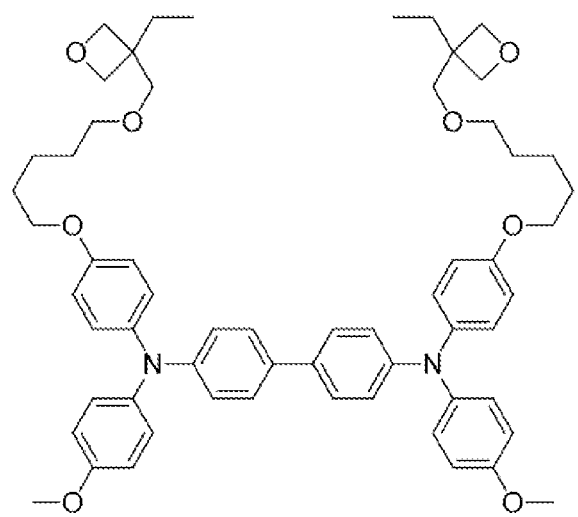
FIG. 10 illustrates the crosslinkable material N4,N4'-Bis (4-(6-((3-ethyloxetan-3-yl)methoxy)hexyloxy)phenyl)-N4, N4'-bis(4-methoxyphenyl)biphenyl-4,4'-diamine (QUPD).

Another example of a crosslinkable material from which the structure described above may be formed is N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), as shown in FIG. 10.

Figure 11:
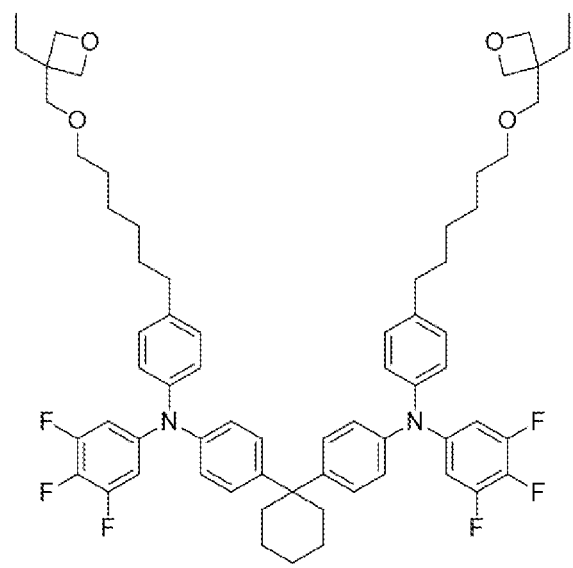
FIG. 11 illustrates the crosslinkable material N,N'-(4,4'-(Cyclohexane-1,1-diyl)bis(4,1-phenylene))bi(N-(4-(6-(2-ethyloxetan-2-yloxy)hexyl)phenyl)-3,4,5-trifluoroaniline) (X-F6-TAPC).

Another example of a crosslinkable material from which the structure described above may be formed is N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), as shown in FIG. 11.

Figure 12:
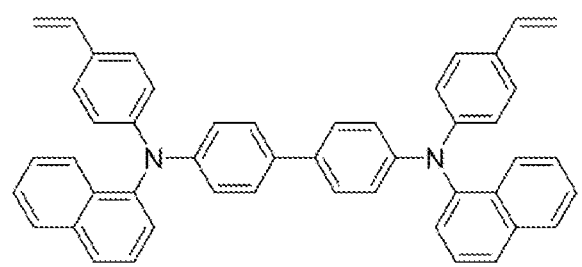
FIG. 12 illustrates the crosslinkable material N4,N4'-Di (naphthalen-1-yl)-N4,N4'-bis(4-vinylphenyl)biphenyl-4,4'-diamine (VNPB).

Another example of a crosslinkable material from which the structure described above may be formed is N4,N4'-Di(naphthalen-1-yl)-N4,N4'-bis(4-vinylphenyl)biphenyl-4,4'-diamine (VNPB), as shown in FIG. 12.

Figure 13:
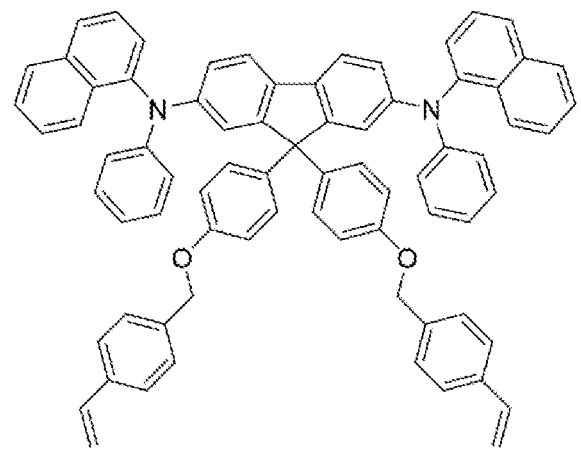
FIG. 13 illustrates the crosslinkable material 9,9-Bis[4-[(4-ethenylphenyl) methoxy]phenyl]-N2,N7-di-1-naphthalenyl-N2,N7-diphenyl-9H-Fluorene-2,7-diamine(VB-FNPD).

Another example of a crosslinkable material from which the structure described above may be formed is 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), as shown in FIG. 13.

Figure 14:
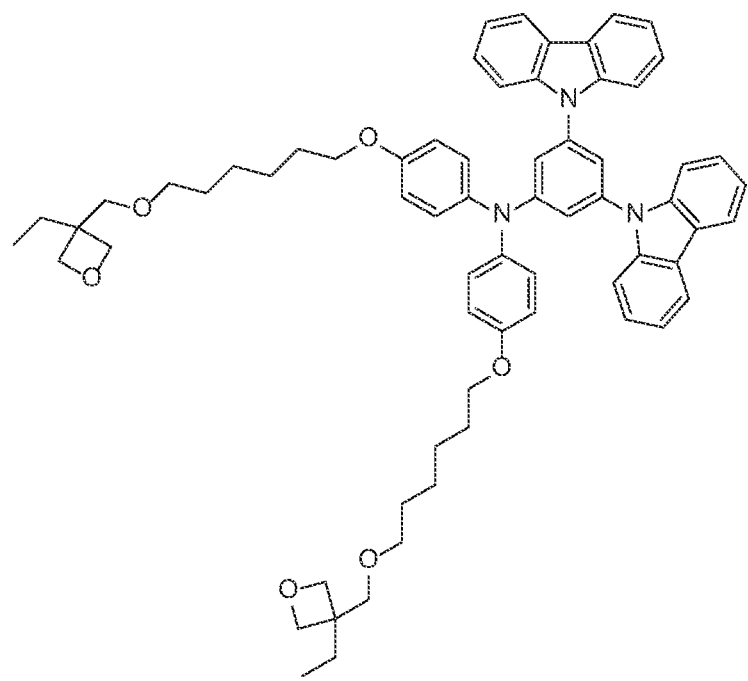
FIG. 14 illustrates the crosslinkable material 3,5-di-9H-carbazol-9-yl-N,N-bis[4-[[6-[(3-ethyl-3-oxetanyl)methoxy] hexyl]oxy]phenyl]-benzenamine (Oxe-DCDPA).

Another example of a crosslinkable material from which the structure described above may be formed is 3,5-di-9H-carbazol-9-yl-N,N-bis[4-[[6-[(3-ethyl-3-oxetanyl)methoxy]hexyl]oxy]phenyl]-benzenamine (Oxe-DCDPA), as shown in FIG. 14.

Nanoparticles Smaller that the QDs

The nanoparticles can be any of the materials described in the "Electron transporting/injecting materials" and in the "QDs and Ligands" sections. In addition, also other materials that can be synthesised as nanoparticles can be used.

Spacers

A spacer or crosslinkable spacer is a material constituted by at least two moieties. The first two are constituted by a functional group with crosslinkable capacities and the third one is an organic backbone that links two or more crosslinkable groups. Optionally the organic backbone can have charge transporting capabilities. Exemplary moieties that may provide charge transporting properties include, but are not limited to, tertiary, secondary, and primary aromatic or aliphatic amines, tryaryl phosphines, and quinolinolates. Exemplary moieties that may provide cross-linking capabilities include, but are not limited to, oxetane, epoxy, thiol, alkene, alkyne, ketone, and aldehyde units. In some implementations, between the two moieties that provide cross-linking capabilities there may be a distance of less than 20 nm.

Exemplary crosslinkable spacers include, but are not limited to, 1,4-Pentadiene; 1,5-Hexadiene; 1,7-heptadiene; 1,7-Octadiene; 1,8-Nonadiene; 1,9-Decadiene; 2-Methyl-1,5-hexadiene; 1,4-Pentadiene; 1,6-Heptadiyne; 1,7-Octadiyne; Propargyl ether; 1,8-Nonadiyne; 1,4-Diethynylbenzene; Dipropargylamine; 4,7,10,13,16-Pentaoxanonadeca-1,18-diyne; 1,3-Diethynylbenzene; 1,4-Diethynylbenzene; 1,3,5-Triethynylbenzene, etc.

Crosslinkable Ligands

A crosslinkable ligand of QD is a material constituted by at least three moieties. The first one is constituted by at least one functional group with crosslinkable capacities, the second one is constituted by at least one functional group that provides linkage to the QD and the third one is an organic backbone that links the at least one functional group with crosslinkable capacities to the at least one functional group that provides linkage to the QD. Optionally the organic backbone can have charge transporting capabilities. Exemplary moieties that may provide charge transporting properties include, but are not limited to, tertiary, secondary, and primary aromatic or aliphatic amines, tryaryl phosphines, and quinolinolates. Exemplary moieties that may provide cross-linking capabilities include, but are not limited to, oxetane, epoxy, thiol, alkene, alkyne, ketone, acrylate, methacrylate, and aldehyde units. Exemplary moieties that may provide linkage to the QD include, but are not limited to, thiol, amine, phosphine, carboxylic acid. In some implementations, between the two moieties that provide cross-linking capabilities there may be a distance of less than 20 nm.

Exemplary crosslinkable ligands include, but are not limited to, benzene-1,4-dithiol, pentaerythritol tetrakis(3-mercaptopropionate) (PETMP); trimethylolpropane tris(3-mercaptopropionate) (TMPMP); 2,2'-(ethylenedioxy)diethanethiol; Tris [2-(3-mercaptopropionyloxy) ethyl] isocyanurate (TEMPIC); 1,3,5-Tris(2-hydroxyethyl) isocyanurate; tris(2,3-epoxypropyl) isocyanurate; trithiocyanuric acid; 1,3,5-tris(2-hydroxyethyl)isocyanurate; glycol Di(3-mercaptopropionate) (GDMP); Di-Pentaerythritol Hexa(3-mercaptopropionate) (DiPETMP); ethoxylated trimethylolpropane tri (3-mercaptopropionate); ethoxylated trimethylolpropane tri (3-mercaptopropionate); polycaprolactone tetra (3-mercaptopropionate); pentaerythritol tetraacrylate, 6-mercaptohexanoic acid; 4-mercaptobutyric acid; 2-mercaptopropionic_acid; pentaerythritol tetraacrylate; 11-mercaptoundecanoic acid; mercaptosuccinic acid; and the like.

Optical Cavity

It is known that for top-emitting apparatuses that include reflective electrodes (e.g. the first electrodes) and partially reflective electrodes (e.g. the second electrode), an optical cavity can be established for the light emitted from QDs by electroluminescence. The distance between the QDs emitting light and the first electrode, and the distance between the QDs emitting light and the second electrode, can have a significant effect on the optical mode of the cavity, and consequently on the properties of the light emitted through the second electrode. For example, such parameters can affect the efficiency of light escaping from the light emitting apparatus, and the dependence of intensity and wavelength on emission direction. Therefore, it is often preferable to select the thickness of layers disposed between the QDs and the electrodes to provide a favorable optical cavity for optimal light efficiency. Suitable thicknesses are different for different wavelengths of light (e.g. different between a apparatus emitting red light and a apparatus emitting green light).

What is claimed is:

1. A light-emitting structure, comprising:
    a substrate; and
    a plurality of sub-pixel structures over the substrate, wherein:
    at least one of the plurality of sub-pixel structures includes:
        an anode,
        a cathode, and
        a combined charge transport and emissive layer disposed between the anode and the cathode,
    the combined charge transport and emissive layer comprises quantum dots (QDs) with ligands, and nanoparticles smaller than the QDs,
    the QDs and the nanoparticles are dispersed in a cross-linked matrix formed at least partially from at least one crosslinkable charge transport material other than the ligands,
    the QDs and the nanoparticles form a flatter surface of the combined charge transport and emissive layer,
    the combined charge transport and emissive layer is arranged such that the QDs are phase segregated as a monolayer on a cathode side outer surface of the at least one crosslinkable charge transport material, and
    the nanoparticles are phase segregated as a monolayer on a cathode side outer surface of the monolayer of the QDs.

2. The light emitting structure of claim 1, wherein the at least one of the plurality of sub-pixel structures further comprises:
    one or more electron injecting or transporting layers between the cathode and the combined charge transport and emissive layer; and
    one or more hole injecting or transporting layers between the anode and the combined charge transport and emissive layer.

3. The light-emitting structure of claim 1, wherein the at least one crosslinkable charge transport material comprises one or more functional groups comprising an epoxide, an oxetane, an alkane, an alkene, an alkyne, a thiol, an acrylate, a methacrylate, an aldehyde, a ketone, a carboxyl, or an azide.

4. The light-emitting structure of claim 1, wherein the ligands of the QDs have one or more functional groups.

5. The light-emitting structure of claim 4, wherein the one or more functional groups of the ligands of the QDs comprise an epoxide, an oxetane, an alkane, an alkene, an alkyne, a thiol, an aldehyde, a ketone, a carboxyl, or an azide.

6. The light emitting structure of claim 1, wherein the combined charge transport and emissive layer further comprises one or more initiators.

7. The light emitting structure of claim 1, wherein at least one of the combined charge transport and emissive layer and one or more interlayers comprises one or more photoinitiators.

8. The light-emitting structure of claim 1, wherein the at least one crosslinkable charge transport material comprises one or more hole transport materials.

9. The light-emitting structure of claim 1, wherein the at least one crosslinkable charge transport material comprises at least one of a tertiary, secondary, or primary aromatic amine, and an aliphatic amine.

* * * * *